(12) United States Patent
Lee et al.

(10) Patent No.: US 7,920,400 B2
(45) Date of Patent: Apr. 5, 2011

(54) SEMICONDUCTOR INTEGRATED CIRCUIT DEVICE AND METHOD OF FABRICATING THE SEMICONDUCTOR INTEGRATED CIRCUIT DEVICE

(75) Inventors: Ju-Yong Lee, Gyeonggi-do (KR); Sung-Ho Jang, Gyeonggi-do (KR); Tae-Young Chung, Gyeonggi-do (KR); Joon Han, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 313 days.

(21) Appl. No.: 12/055,035

(22) Filed: Mar. 25, 2008

(65) Prior Publication Data

US 2008/0266927 A1    Oct. 30, 2008

(30) Foreign Application Priority Data

Apr. 27, 2007    (KR) .................. 10-2007-0041561

(51) Int. Cl.
    *G11C 5/06* (2006.01)
(52) U.S. Cl. .............. 365/63; 365/174; 365/72; 365/51; 257/306
(58) Field of Classification Search .................. 365/174, 365/63, 72, 51; 257/306
    See application file for complete search history.

(56) References Cited

U.S. PATENT DOCUMENTS

| | | | | |
|---|---|---|---|---|
| 5,691,551 A | * | 11/1997 | Eimori | 257/303 |
| 6,156,601 A | * | 12/2000 | Lee et al. | 438/238 |
| 2005/0012125 A1 | * | 1/2005 | Summerfelt et al. | 257/295 |
| 2007/0296045 A1 | * | 12/2007 | Tanaka | 257/396 |
| 2010/0148236 A1 | * | 6/2010 | Kadoya | 257/306 |

FOREIGN PATENT DOCUMENTS

| | | |
|---|---|---|
| KR | 2001-0014953 | 2/2001 |
| KR | 2001-0020983 | 3/2001 |
| KR | 2002-0061871 | 7/2002 |
| KR | 2002-0066586 | 8/2002 |
| KR | 2006-0073110 | 6/2006 |

OTHER PUBLICATIONS

English language abstract of Korean Publication No. 2001-0014953.
English language abstract of Korean Publication No. 2002-0061871.
English language abstract of Korean Publication No. 2002-0066586.

* cited by examiner

*Primary Examiner* — Vu A Le
*Assistant Examiner* — Han Yang
(74) *Attorney, Agent, or Firm* — F. Chau & Associates, LLC

(57) ABSTRACT

A semiconductor integrated circuit device having a $6F^2$ layout is provided. The semiconductor integrated circuit device includes a substrate; a plurality of unit active regions disposed in the substrate and extending in a first direction; first and second access transistors including first and second gate lines disposed on the substrate and extending across the unit active regions in a second direction forming an acute angle with the first direction; a first junction area disposed in the substrate between the first and second gate lines and second junction areas disposed on sides of the first and second gate lines where the first junction area is not disposed; a plurality of bitlines disposed on the substrate and extending in a third direction forming an acute angle with the first direction; and a plurality of bitline contacts directly connecting the first junction area and the bitlines.

18 Claims, 23 Drawing Sheets

SEMICONDUCTOR INTEGRATED CIRCUIT DEVICE AND METHOD OF FABRICATING THE SEMICONDUCTOR INTEGRATED CIRCUIT DEVICE

CROSS-REFERENCE TO RELATED APPLICATION

This application claims priority under 35 USC §119 to Korean Patent Application No. 10-2007-0041561 filed on Apr. 27, 2007 in the Korean Intellectual Property Office, the contents of which are incorporated herein by reference in their entirety.

BACKGROUND

1. Technical Field

The present invention relates to a semiconductor integrated circuit device and more particularly to a semiconductor integrated circuit device having a $6F^2$ layout.

2. Description of the Related Art

Various methods have been suggested for increasing the integration density of semiconductor integrated circuit devices in order to increase the yield of the semiconductor integrated circuit devices. For example, reducing the design rule or modifying existing memory cell structures could both result in increased integration density for a semiconductor integrated circuit device. In particular, the existing $8F^2$ layout could be replaced by a $6F^2$ layout for the purpose of enhancing the integration density. Since the $6F^2$ layout can reduce the size of unit memory cells to ¼ of the size of memory cells in the $8F^2$ layout, the $6F^2$ layout is more suitable than the $8F^2$ layout when manufacturing highly integrated semiconductor integrated circuit devices. However, it is difficult to enhance productivity using the $6F^2$ layout due to its structural weakness and close tolerances.

SUMMARY

According to an aspect of the present invention, there is provided a semiconductor integrated circuit device including: a substrate; a plurality of unit active regions which are formed in the substrate and extend in a first direction; first and second access transistors which include first and second gate lines that are formed on the substrate and that extend across the unit active regions in a second direction forming an acute angle with the first direction; a first junction area that is formed in the substrate between the first and second gate lines, and second junction areas that are formed on one side of the first and second gate lines where the first junction area is not disposed, and that are located on opposite sides of the first junction area; a plurality of bitlines which are formed on the substrate and extend in a third direction forming an acute angle with the first direction; and a plurality of bitline contacts which directly connect the first junction area and the bitlines.

BRIEF DESCRIPTION OF THE DRAWINGS

The above and other aspects and features of the present invention will become apparent by describing in detail exemplary embodiments thereof with reference to the attached drawings, in which.

DETAILED DESCRIPTION

Figure 1A:
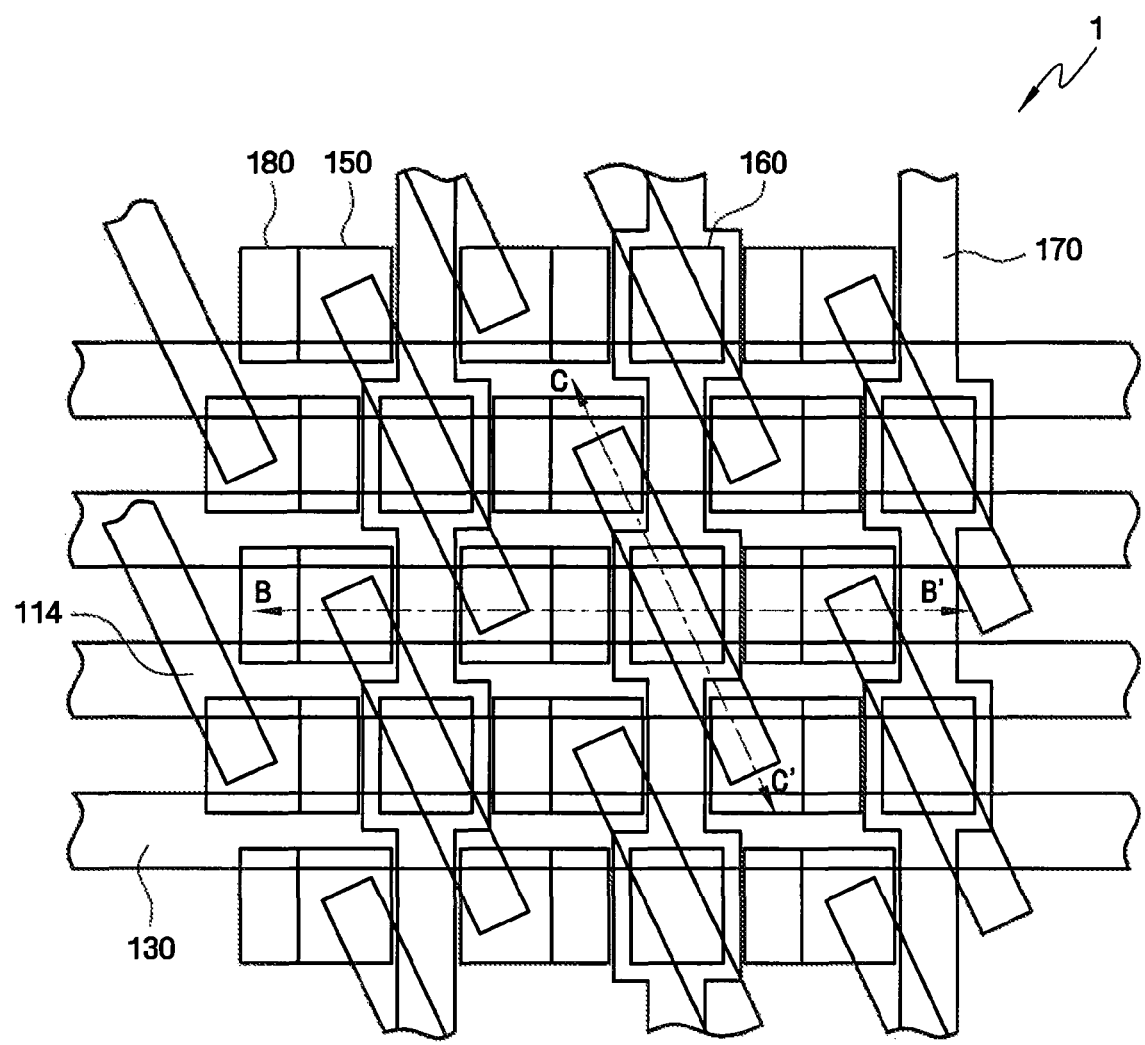
FIG. 1A is a layout of a semiconductor integrated circuit device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It should be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

Figure 1B:
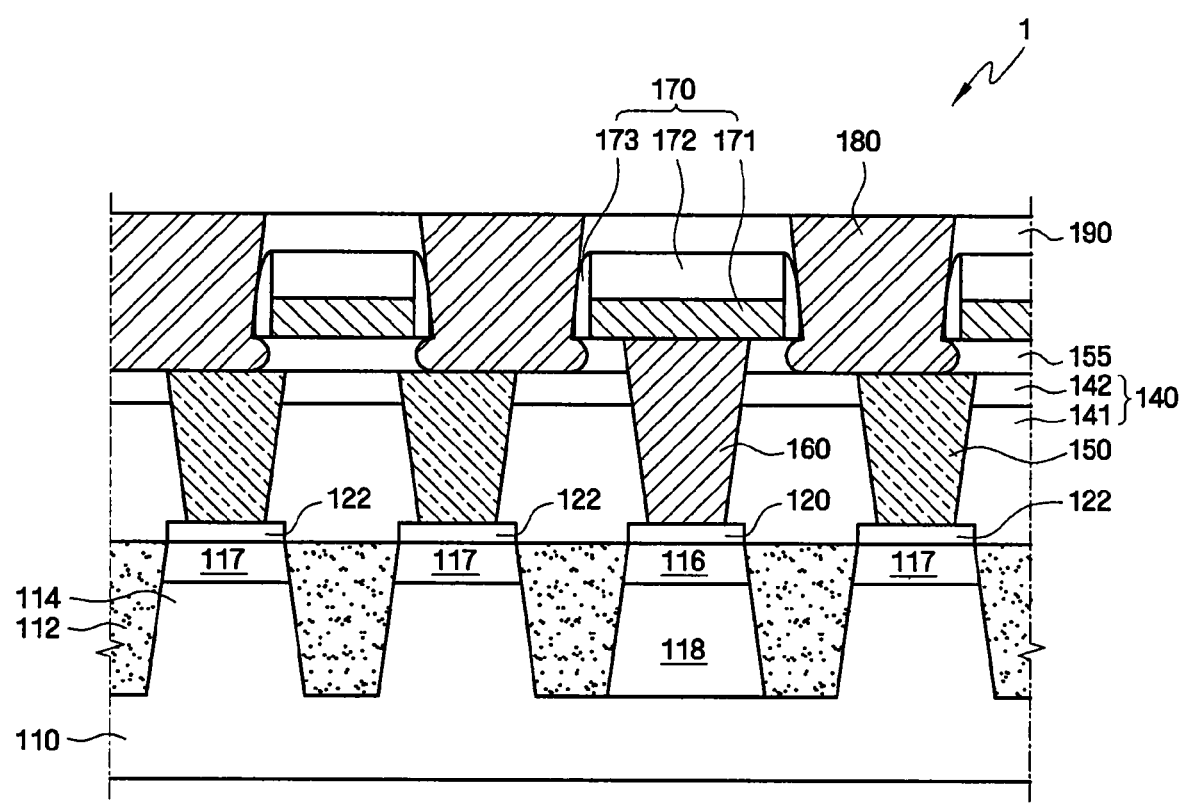
FIG. 1B is a cross-sectional view taken along line B-B' of FIG. 1A.
Figure 1C:
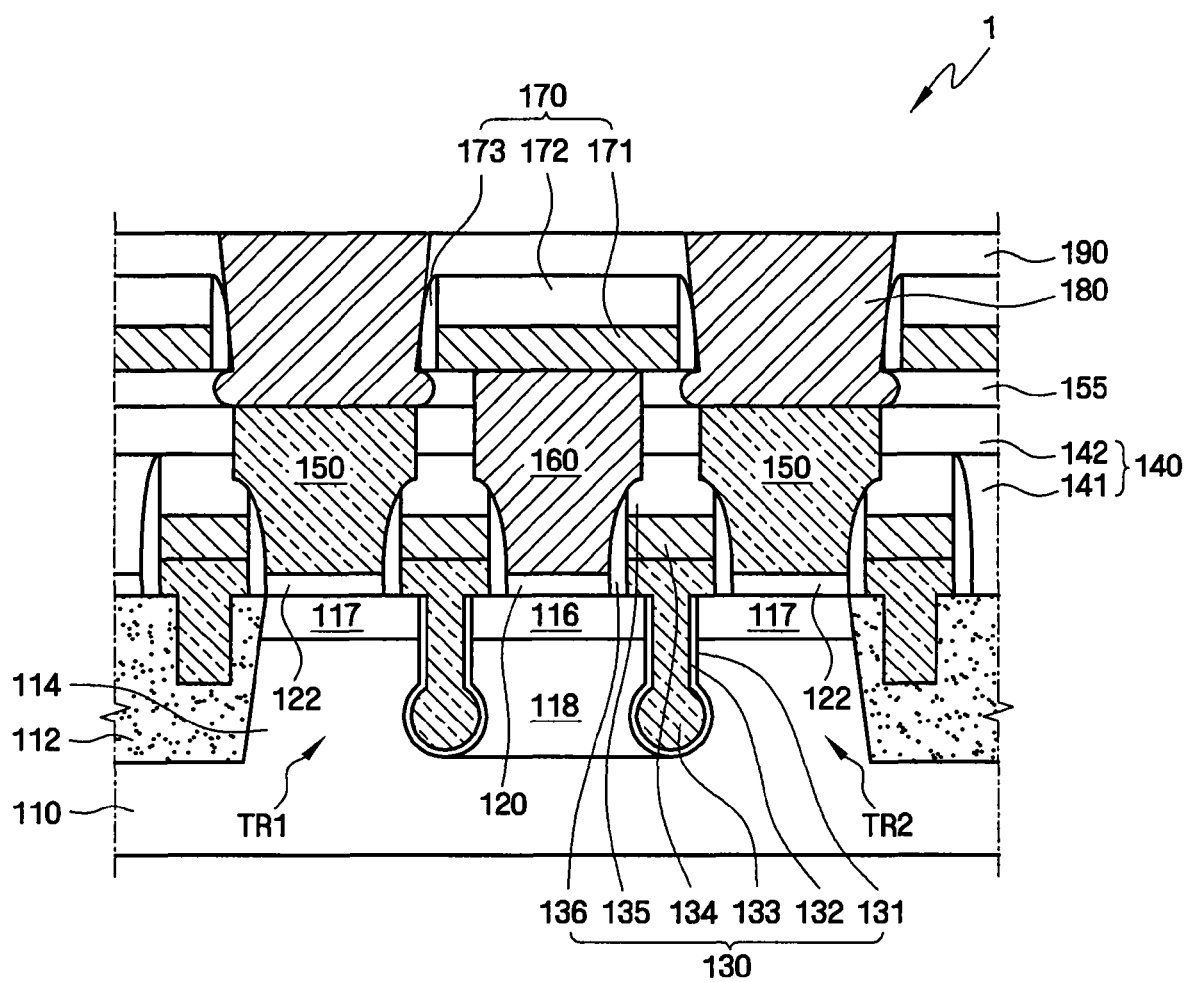
FIG. 1C is a cross-sectional view taken along line C-C' of FIG. 1A.
Figure 2:
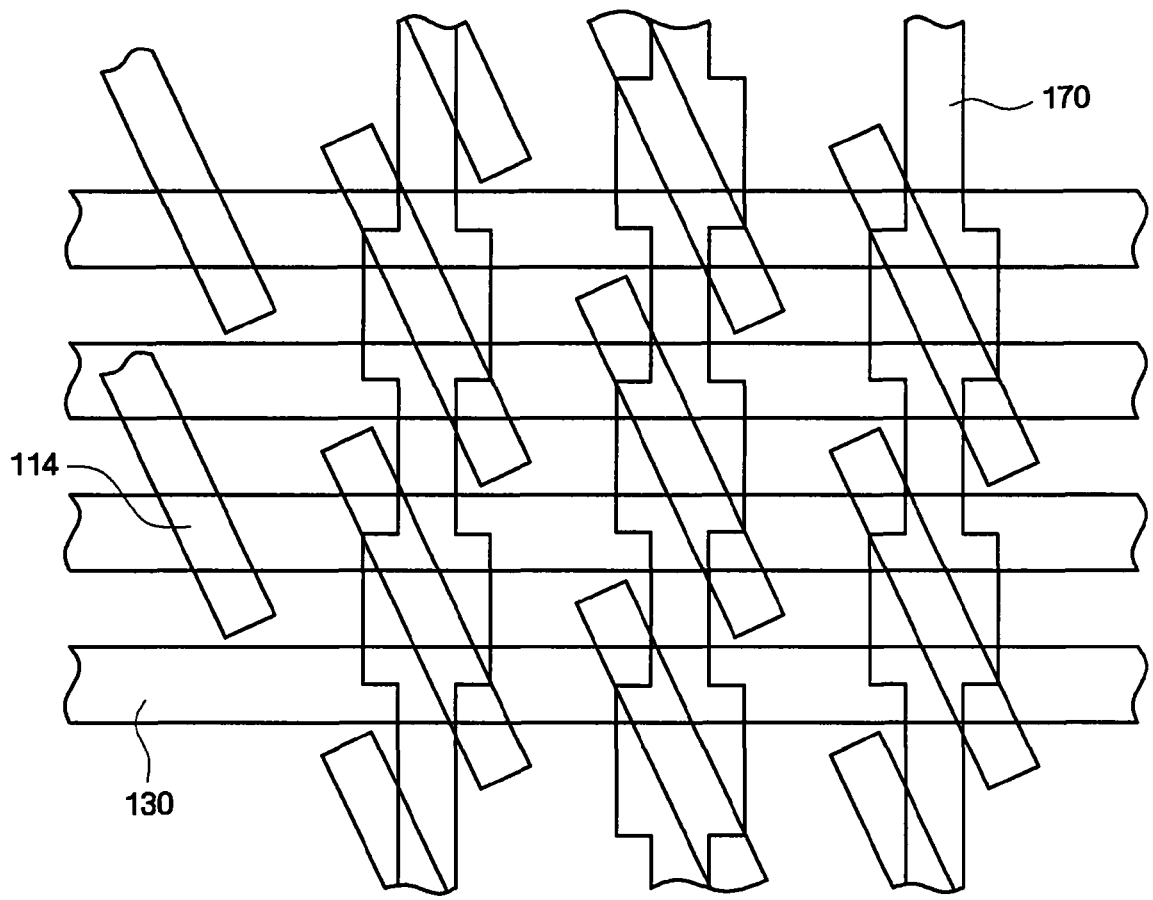
FIG. 2 is a layout view illustrating the relationship between unit active regions, gate lines, and bitlines of the semiconductor integrated circuit device of FIG. 1A.
Figure 2:
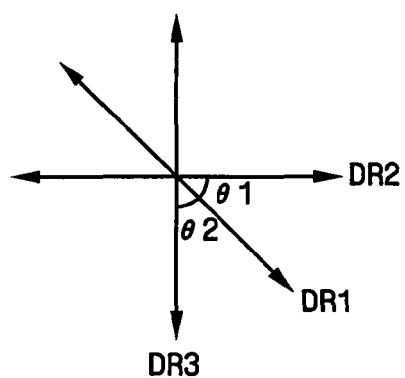
Figure 3:
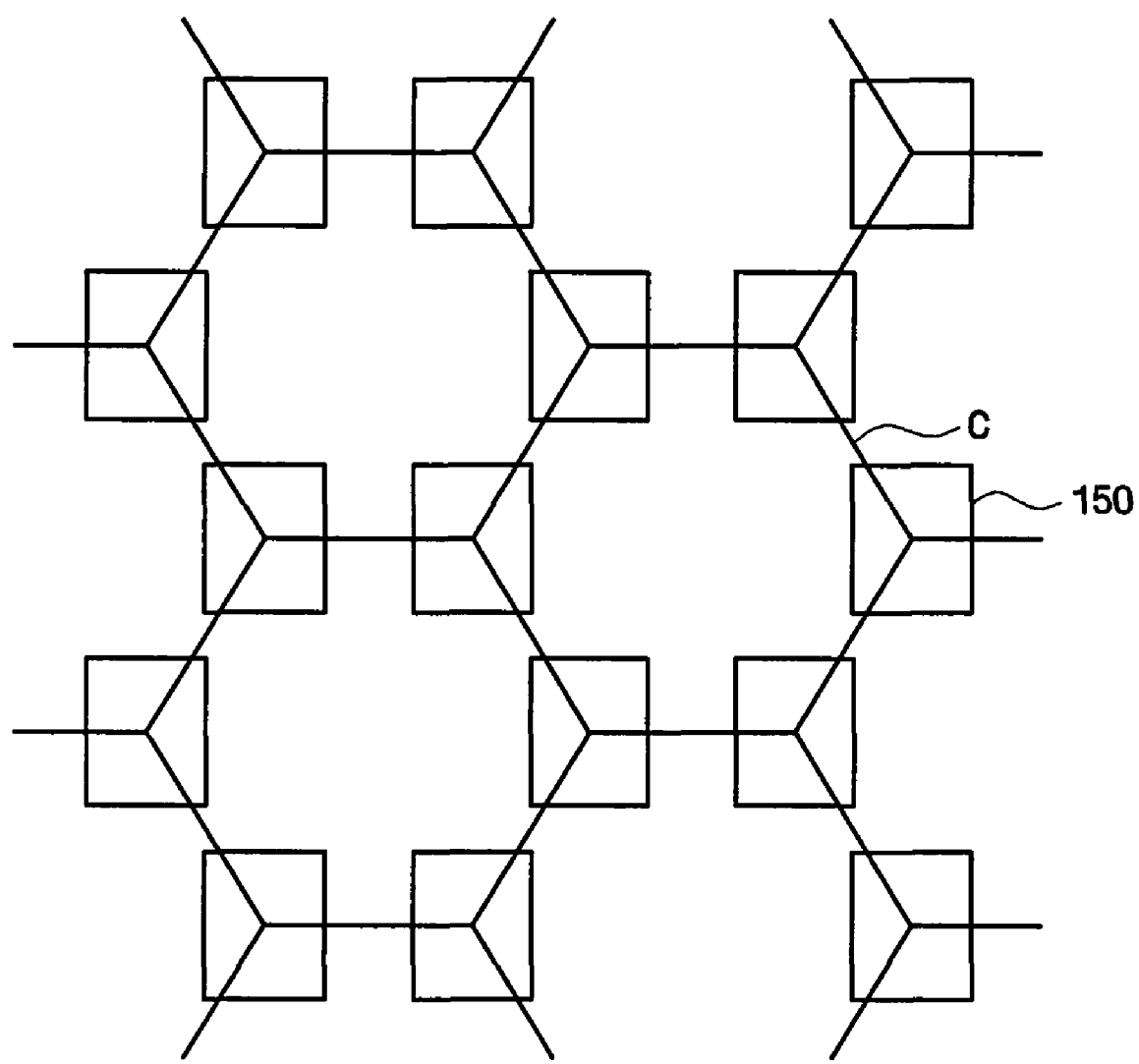
FIG. 3 is a layout view illustrating the arrangement of contact pads of the semiconductor integrated circuit device of FIG. 1A.
Figure 4:
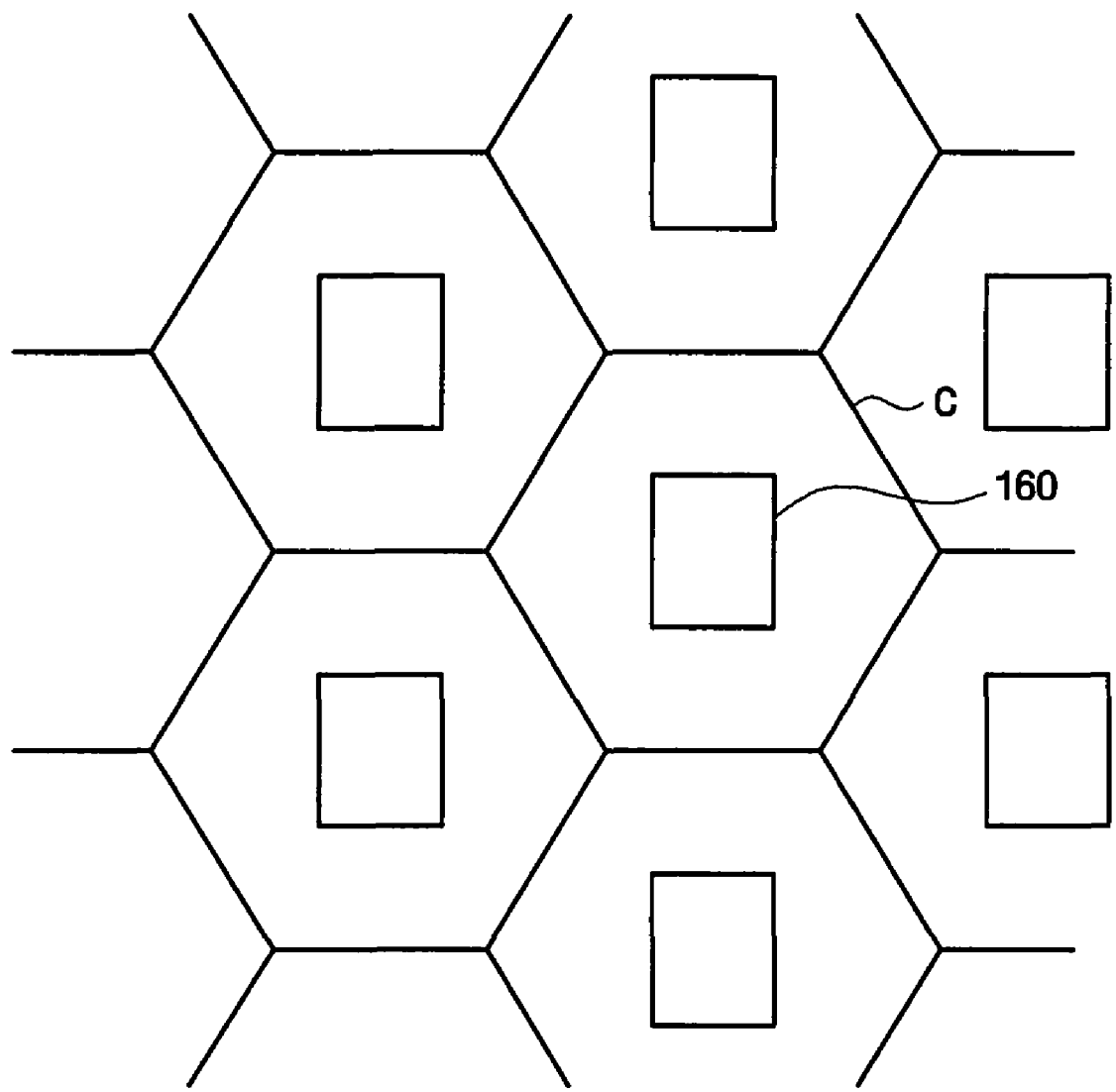
FIG. 4 is a layout view illustrating the arrangement of the bitlines of the semiconductor integrated circuit device of FIG. 1A.
Figure 5:
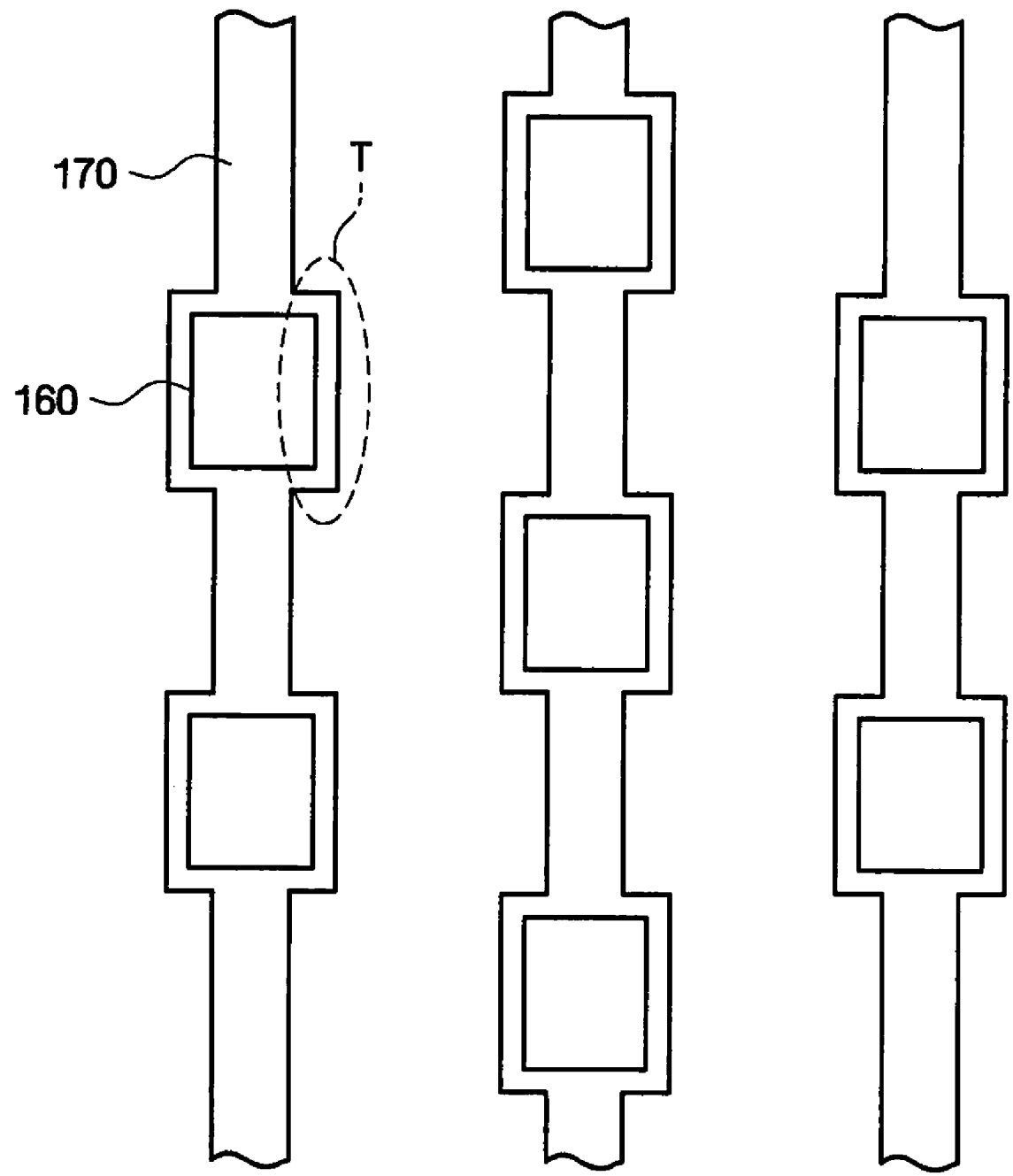
FIG. 5 is a layout view illustrating the arrangement of bitline contacts and the bitlines of the semiconductor integrated circuit device of FIG. 1A.

FIG. 1A is a layout of an integrated semiconductor circuit device 1 according to an embodiment of the present invention, FIG. 1B is a cross-sectional view taken along line B-B' of FIG. 1A, and FIG. 1C is a cross-sectional view taken along line C-C' of FIG. 1A. FIG. 2 is a layout view illustrating the relationship between unit active regions 114, gate lines 130, and bitlines 170 of the semiconductor integrated circuit device of FIG. 1A. FIG. 3 is a layout view illustrating the arrangement of contact pads 150 of the semiconductor integrated circuit device of FIG. 1A. FIG. 4 is a layout view illustrating the arrangement of the bitlines 170 of the semiconductor integrated circuit device of FIG. 1A. FIG. 5 is a layout view illustrating the arrangement of bitline contacts 160 and the bitlines 170 of the semiconductor integrated circuit device of FIG. 1A.

Referring to the semiconductor integrated circuit device illustrated in FIGS. 1A through 1C, the unit active regions 114 are formed in a substrate 110. The gate lines 130 extend across the unit active regions 114. The bitlines 170 are formed on the substrate 110. A plurality of storage electrodes (not shown) are formed on the substrate 110. First and second epitaxial layers 120 and 122 are respectively formed on both sides of each of the gate lines 130. The first epitaxial layer 120 is directly connected to the bitlines 170 via the bitline contacts 160, and the second epitaxial layer 122 is connected to the storage electrodes via connecting structures, i.e., contact pads 150 and storage node contacts 180. The contact pads 150 are formed on the second epitaxial layer 122, and the storage node contacts 180 are respectively formed on the contact pads 150, and are connected to the storage electrodes.

Referring to FIG. 2, the unit active regions 114 are defined by forming a plurality of field regions 112 in the substrate 110. In a 6F$^2$ layout, in particular, the active regions 114 are formed diagonally, rather than vertically or horizontally. Specifically, the unit active regions 114 extend in a first direction DR1, the gate lines 130 (or wordlines) extend in a second direction DR2, and the bitlines 170 extend in a third direction DR3 where the second direction DR2 forms an acute angle with the first direction DR1 and the third direction DR3 also forms an acute angle with the first direction DR1.

The term "an angle between a pair of directions," as used herein, denotes whichever of two angles formed by a pair of directions is less than the other. For example, when a pair of directions forms angles of 120° and 60°, the angle between the pair of directions is 60°. Therefore, referring to FIG. 2, an angle between the first direction DR1 and the second direction DR2 is θ1, and an angle between the first direction DR1 and the third direction DR3 is θ2.

When the angles θ1 and θ2 are both acute angles, the bitline contacts 160, which connect the unit active regions 114 and the bitlines 170, can be at a maximum possible distance from the contact pads 150, which connect the unit active regions 114 and the storage node contacts 180. The angles θ1 and θ2 may both be 45°, may be 30° and 60°, respectively, or may be 60° and 30°, respectively.

Referring to FIGS. 1A through 1C, a pair of gate lines 130 may extend across a unit active region 114. In this case, two access transistors TR1 and TR2 may be formed on a unit active region 114. Specifically, two gate lines 130 extend across a unit active region 114, a first junction area 116 is formed in the unit active region 114, and second junction areas 117 are located on the opposite sides of the first junction area 116. That is, the access transistors TR1 and TR2 share the first junction area 116, but do not share the second junction areas 117.

The first epitaxial layer 120, which is formed on the first junction area 116, is directly connected to the bitlines 170 via the bitline contacts 160, and the second epitaxial layer 122, which is formed on the second junction areas 117, is connected to the storage electrodes via the contact pads 150 and the storage node contacts 180. The contact pads 150 may be formed of doped polysilicon, and the bitline contacts 160 and the storage node contacts 180 may be formed of a metal (e.g., titanium (Ti) or tungsten (W)). However, the present invention is not limited to this. For example, the bitline contacts 160 may be formed of doped polysilicon. The first and second epitaxial layers 120 and 122 may have the same conductivity type (e.g., N-type) as the first junction area 116 and the second junction areas 117. The first and second epitaxial layers 120 and 122 may be formed using an ion implantation method, or may be grown by putting the substrate 110 in a chamber, and then injecting a silicon source gas and a dopant source gas into the chamber.

The connection of the first epitaxial layer 120 and the bitlines 170 via the bitline contacts 160 offers many advantages over the connection of the first epitaxial layer 120 and the bitlines 170 via a plurality of contact pads and a plurality of contacts that are respectively formed on the contact pads (i.e., the method used to connect the second epitaxial layer 122 and a plurality of storage electrodes). Specifically, since the size of unit memory cells in a 6F$^2$ layout is about ¼ of the size of unit memory cells in an 8F$^2$ layout, there is the need to secure sufficient width margins for the storage node contacts 180 to properly place the storage node contacts 180 in contact with the contact pads 150. For this, a plurality of contact holes may be formed using an isotropic etching method (e.g., a dry etching method), and, then, the lower portions of the contact holes may be enlarged using an isotropic etching method. This will be described later in further detail with reference to FIGS. 13A through 13C and 1A through 1C. For example, the lower portions of the storage node contacts 180 may be wider than the upper portions of the storage node contacts 180.

When the bitlines 170 are connected to the first epitaxial layer 120 via a plurality of contact pads which are formed of doped polysilicon and a plurality of contacts which are formed of a metal on the contact pads, respectively, metal silicide (e.g., TiSix) is formed between the contact pads and the contacts. The metal silicide between the contact pads and the contacts may be removed by an etchant (e.g., HF) used to perform an isotropic etching operation. Then, the resistance between the contact pads and the respective contacts may considerably increase, and 2-bit failures may become more likely to occur. However, according to the embodiment of FIGS. 1A through 5, the bitlines 170 are connected to the first epitaxial layer 120 via the bitline contacts 160. Thus, no metal silicide is generated between the first epitaxial layer 120 and the bitlines 170. Therefore, it is possible to minimize the occurrence of 2-bit failures.

The bitline contacts 160 may be formed of a metal, e.g., titanium (Ti). In this case, the first epitaxial layer 120 may be formed on the first junction area 116 in order to avoid problems that may arise when the bitline contacts 160 are placed in direct contact with the substrate 110. Specifically, if the bitline contacts 160, which are formed of a metal, are placed in direct contact with the substrate 110, which is formed of silicon, metal silicide (e.g., TiSix) may undesirably grow between the bitline contacts 160 and the substrate 110, and may thus encroach into the first junction area 116, i.e., an encroachment phenomenon may occur. As a result of the encroachment phenomenon, a considerable amount of leakage current is generated, and the refresh time characteristics of the semiconductor integrated circuit device deteriorate. However, if the first epitaxial layer 120 is interposed between the bitline contacts 160 and the substrate 110, the first epitaxial layer 120 may serve as a buffer, and may thus prevent metal silicide, if any, formed between the bitline contacts 160 and the substrate 110, from encroaching into the first junction area 116. In addition, since the size of unit memory cells in a $6F^2$ layout is very small, the transistor characteristics of the semiconductor integrated circuit device 1 may deteriorate considerably due to a short channel effect. However, by using the first and second epitaxial layers 120 and 122, it is possible to obtain the benefits of increasing the length of channels and thus to reduce the probability of occurrence of the short channel effect.

According to the embodiment of FIGS. 1A through 5, the unit active regions 114 and the gate lines 130 are arranged as illustrated in FIG. 2, and the contact pads 150 are not formed on the first epitaxial layer 120 but instead are formed only on the second epitaxial layer 122. Thus, the contact pads 150 may be respectively disposed at the apexes of a hexagonal honeycomb structure, as illustrated in FIG. 3. The hexagonal honeycomb structure is formed by a group of cells C which are hexagonal. In the hexagonal honeycomb structure, each cell C adjoins six other cells C, sharing a side with each of them. Referring to FIG. 4, the bitline contacts 160 are formed in respective corresponding cells C which form a hexagonal honeycomb structure together. However, the hexagonal honeycomb structures illustrated in FIGS. 3 and 4 are only exemplary.

Referring to FIGS. 1A through 1C, the access transistors TR1 and TR2 may have recessed channels. That is, each of the gate lines 130 may include a recessed trench 131 which is formed narrowly and deeply in the substrate 110, a gate insulation layer 132 which is conformally formed in the recessed trench 131, and a stack structure which is formed on the gate insulation layer 132, fills the recessed trench 131, and protrudes above the recessed trench 131.

Referring to FIG. 1C, a lower portion of the recessed trench 131 may be enlarged compared to an upper portion of the recessed trench 131, and may be spherical. In this case, it is possible to obtain the benefits of increasing the length of channels and to improve the refresh time characteristics of the semiconductor integrated circuit device 1 by preventing concentration of an electric field so that the amount of leakage current can be reduced. The width of the stack structure, which protrudes above the substrate 110, may be greater than the width of the recessed trench 131. The stack structure may include a stack of a doped polysilicon layer pattern 133, a metallic layer pattern 134, and a mask layer pattern 135. The metallic layer pattern 134 may be formed of tungsten (W), and the mask layer pattern 135 may be formed of SiN or SiON. A pair of spacers 136 may be respectively formed on both sidewalls of the stack structure. The spacers 136 may be formed of a material having high etching selectivity to a first interlayer dielectric layer pattern 140. For example, the spacers 136 may be formed of SiN, SiON, or $SiO_2$.

According to the embodiment of FIGS. 1A through 5, the semiconductor integrated circuit device 1 may also include a third junction area 118 which is formed between the recessed channels of the access transistors TR1 and TR2 and is disposed below the first junction area 116. The third junction area 118 is provided for asymmetrically forming recessed channels when a gate voltage is applied to the gate lines 130. That is, when a gate voltage is applied to the gate lines 130, a recessed channel, which is overlapped by the third junction area 118, is formed earlier than a recessed channel that is not overlapped by the third junction area 118.

According to the embodiment of FIGS. 1A through 5, the third junction area 118 may be fully localized between the recessed channels of the access transistors TR1 and TR2, instead of spreading to surrounding areas; this will be described later in further detail with reference to FIGS. 11A through 11C.

Referring to FIG. 5, a number of tabs T are respectively formed at the contacts between the bitline contacts 160 and the bitlines 170 so that the bitline contacts 160 can be properly placed in contact with the bitlines 170, and so that the resistance between the bitline contacts 160 and the bitlines 170 can be sufficiently reduced. Each of the bitlines 170 may include a stack of a metallic layer pattern 171 and a mask layer pattern 172. A pair of spacers 173 may be respectively formed on both sidewalls of each of the bitlines 170.

Referring to FIGS. 1A through 1C, reference numerals 141, 142, 155, and 190 indicate an insulation layer pattern, a capping layer pattern, a second interlayer dielectric layer pattern, and a third interlayer dielectric layer pattern, respectively.

Figure 6:
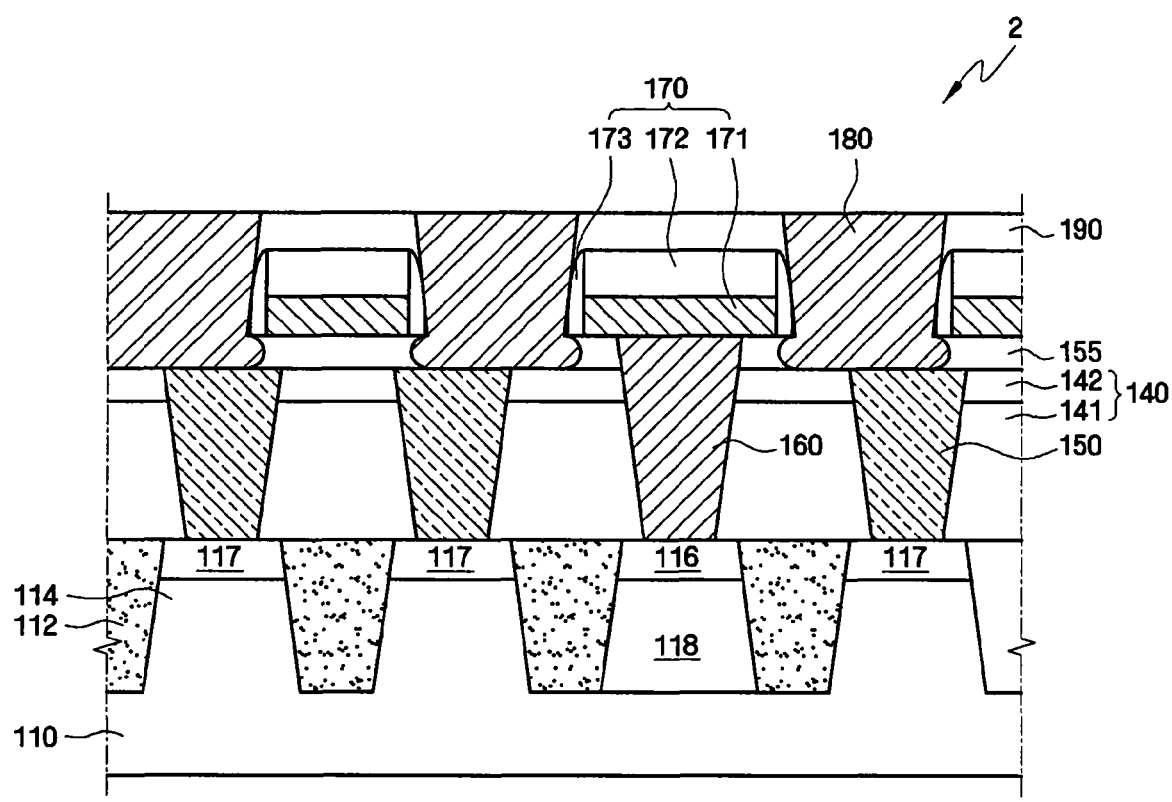
FIG. 6 is a cross-sectional view of a semiconductor integrated circuit device according to another embodiment of the present invention.

FIG. 6 is a cross-sectional view of a semiconductor integrated circuit device 2 according to another embodiment of the present invention. Referring to FIG. 6, the semiconductor integrated circuit device 2 is different from the semiconductor integrated circuit device 1 illustrated in FIGS. 1A through 5 in that the semiconductor integrated circuit device 2 does not include any epitaxial layers whereas the semiconductor integrated circuit device 1 includes the first and second epitaxial layers 120 and 122. According to the embodiment of FIG. 6, there is a need to adjust processing conditions for the fabrication of the semiconductor integrated circuit device 2, and thus to prevent metal silicide formed by placing a plurality of bitline contacts 160, which are formed of a metal, in direct contact with a substrate 110, which is formed of silicon, from encroaching into the first junction area 116.

Figure 7:
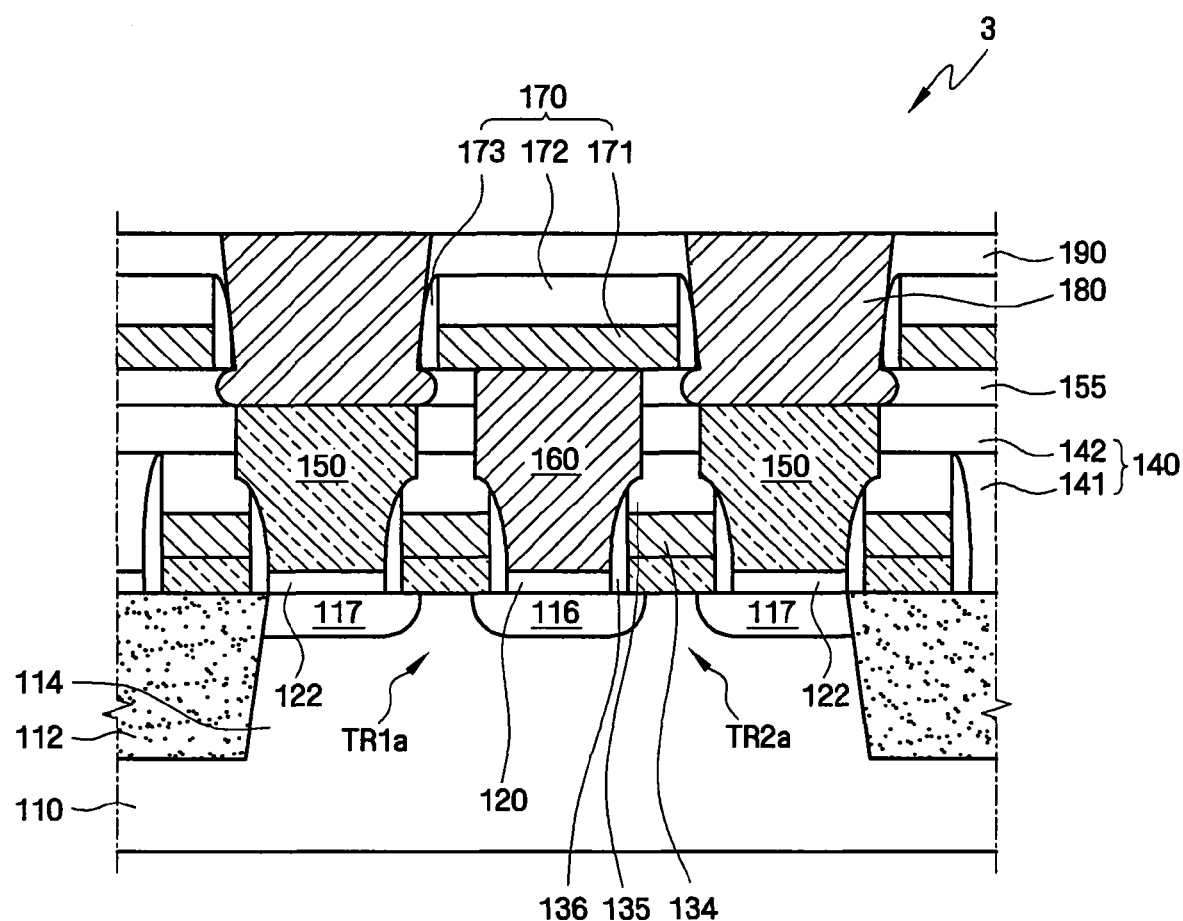
FIG. 7 is a cross-sectional view of a semiconductor integrated circuit device according to another embodiment of the present invention.

FIG. 7 is a cross-sectional view of a semiconductor integrated circuit device 3 according to another embodiment of the present invention. Referring to FIG. 7, the semiconductor integrated circuit device 3 is different from the semiconductor integrated circuit device 1 illustrated in FIGS. 1A through 5 in that the access transistors TR1$a$ and TR2$a$ of the semiconductor integrated circuit device 3 do not have any recessed channels.

Figure 8:
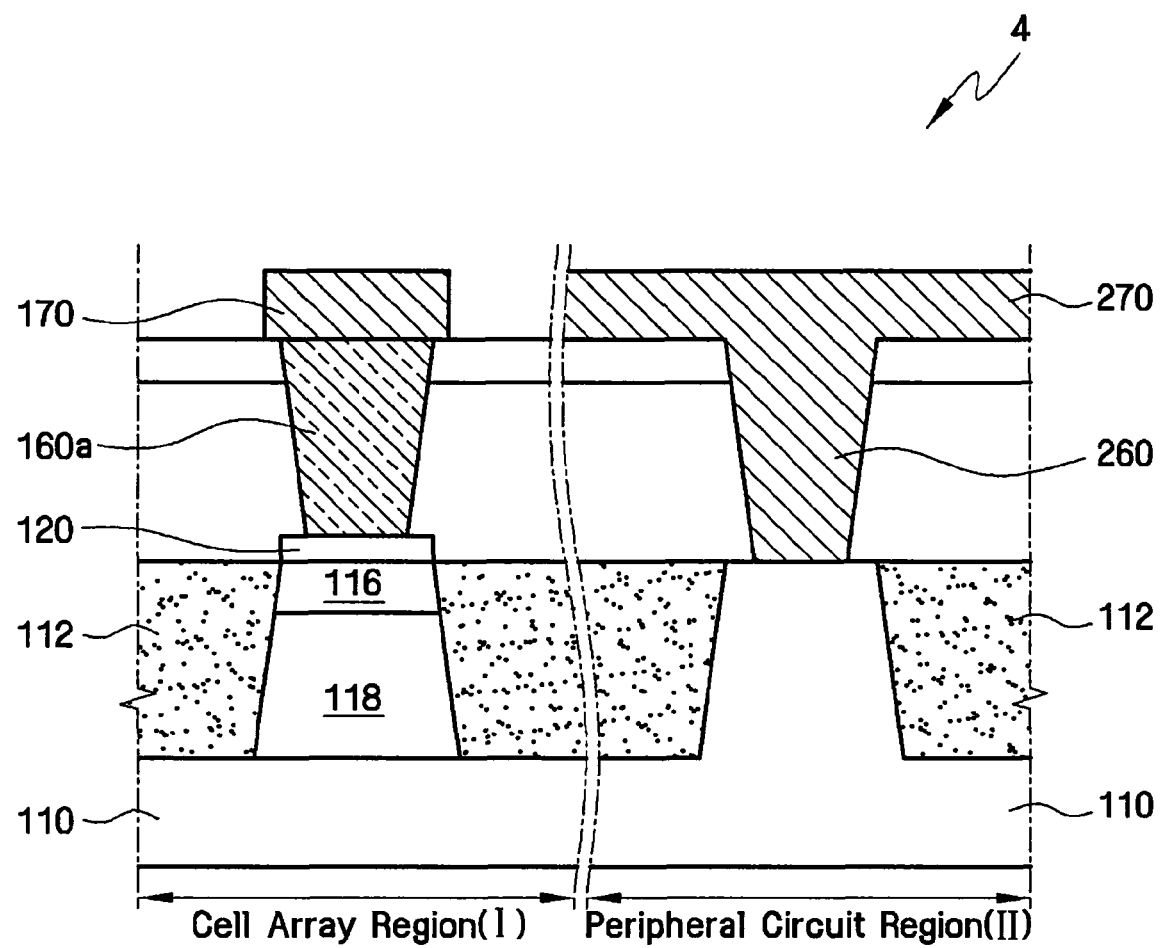
FIG. 8 is a cross-sectional view of a semiconductor integrated circuit device according to another embodiment of the present invention.

FIG. 8 is a cross-sectional view of a semiconductor integrated circuit device 4 according to another embodiment of the present invention. Referring to the semiconductor integrated circuit device 4 illustrated in FIG. 8, a bitline 170 and a bitline contact 160a are formed of different materials in a cell array region I, and a conductive line 270 and the contact 260 are formed of the same material in a peripheral circuit region II. The contact 260 connects the conductive line 270 in a predetermined area in the peripheral circuit region II. For example, the bitline 170 may be formed of a metal, and the bitline contact 160a may be formed of doped polysilicon. The conductive line 270 and the contact 260 may be formed of a metal. The bitline 170 may be level with the conductive line 270.

Referring to FIG. 8, a first epitaxial layer 120 is formed on a first junction area 116 in the cell array region I. The first epitaxial layer 120, however, may be optional. As shown in FIG. 8, no epitaxial layer is formed in the peripheral circuit region II. However, an epitaxial layer may be formed in the peripheral circuit region II.

A method of fabricating a semiconductor integrated circuit device according to an embodiment of the present invention will hereinafter be described in detail with reference to FIGS. 1A through 1C and 9A through 13C.

FIGS. 9A through 13C are layouts and cross-sectional views illustrating a method of fabricating a semiconductor integrated circuit device according to an embodiment of the present invention.

Figure 9A:
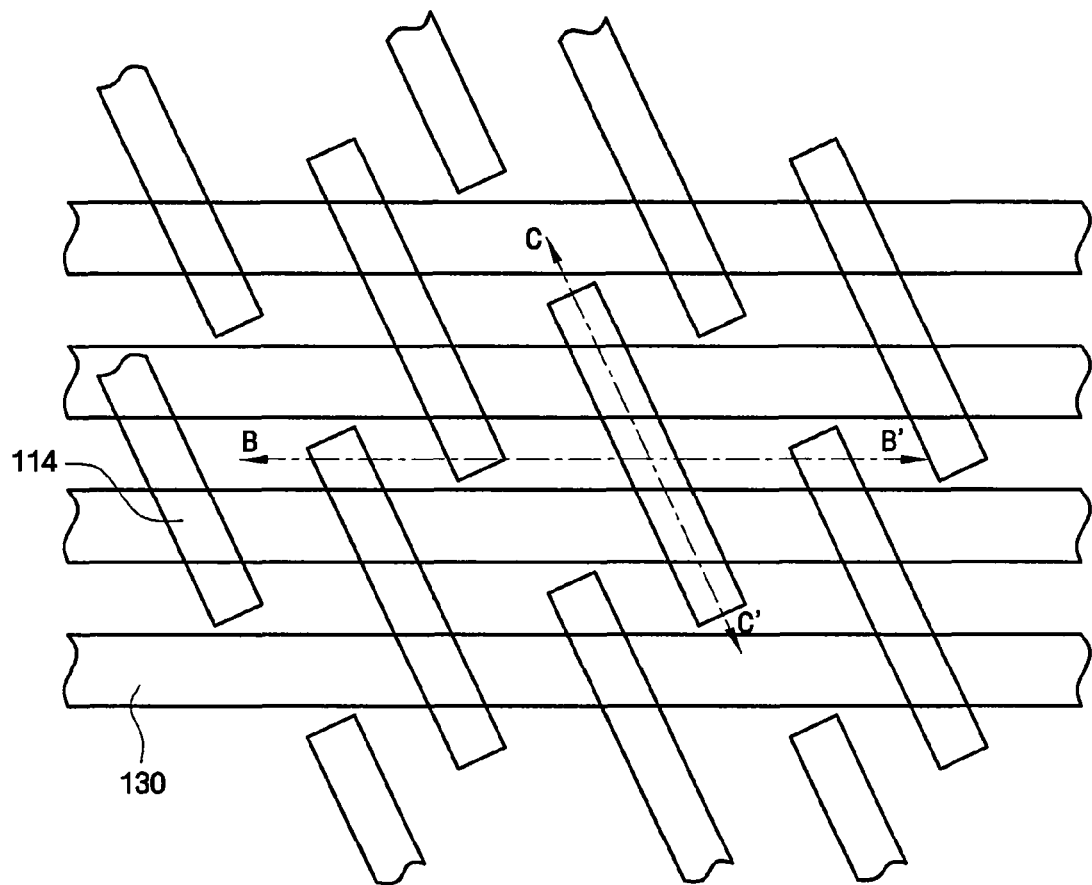
FIGS. 9A through 13C are layout and cross-sectional views illustrating a method of fabricating a semiconductor integrated circuit device according to an embodiment of the present invention.
Figure 9B:
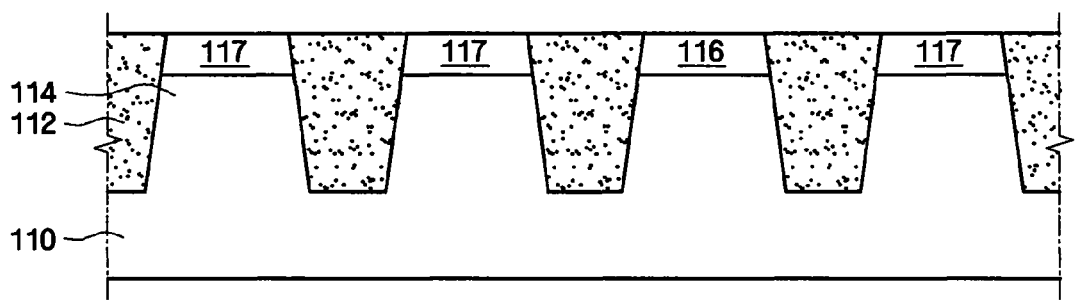
Figure 9C:
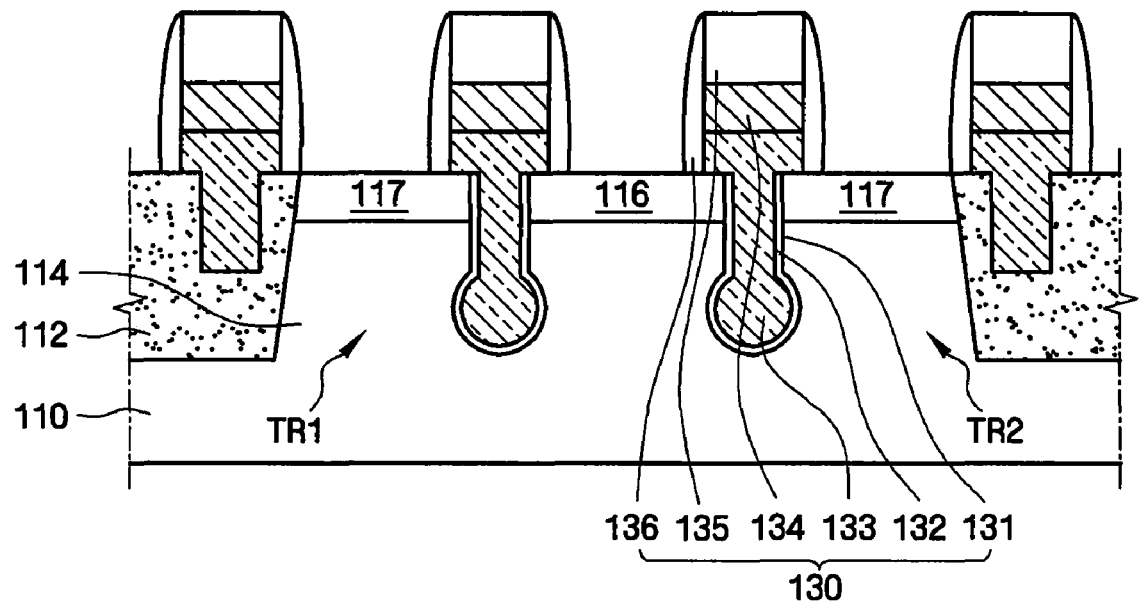

Referring to FIGS. 9A through 9C, a plurality of field regions 112 are formed in a substrate 110, thereby defining a plurality of unit active regions 114 which extend in a first direction DR1. The field regions 112 may be shallow trench isolations (STIs), but the present invention is not limited thereto.

Thereafter, a plurality of gate lines 130 are formed in a second direction DR2 and extend across the unit active regions 114. The second direction DR2 forms an acute angle with the first direction DR1.

Specifically, a plurality of trenches are formed in the substrate 110 using an anisotropic etching method (e.g., a dry etching method). Thereafter, a plurality of recessed trenches 131 is formed by further etching the trenches using an isotropic etching method so that the lower portions of the trenches can become spherical. The isotropic etching method may be a wet etching method that involves the use of a mixed solution of, for example, $NH_4OH$, $H_2O_2$ and $H2O$, or a chemical dry etching (CDE) method that involves the use of $CF_4$ and $O_2$ radicals, but the present invention is not limited thereto. Thereafter, a gate insulation layer 132 is conformally formed in the recessed trenches 131. Next, a plurality of doped polysilicon layer patterns 133, a plurality of metallic layer patterns 134, and a plurality of mask layer patterns 135 are formed on the gate insulation layer 132 so that they can sufficiently fill the recessed trenches 131.

Thereafter, a first junction area 116 and second junction areas 117 are formed by implanting impurity ions into the unit active regions 114 using the gate lines 130 as masks.

Figure 10A:
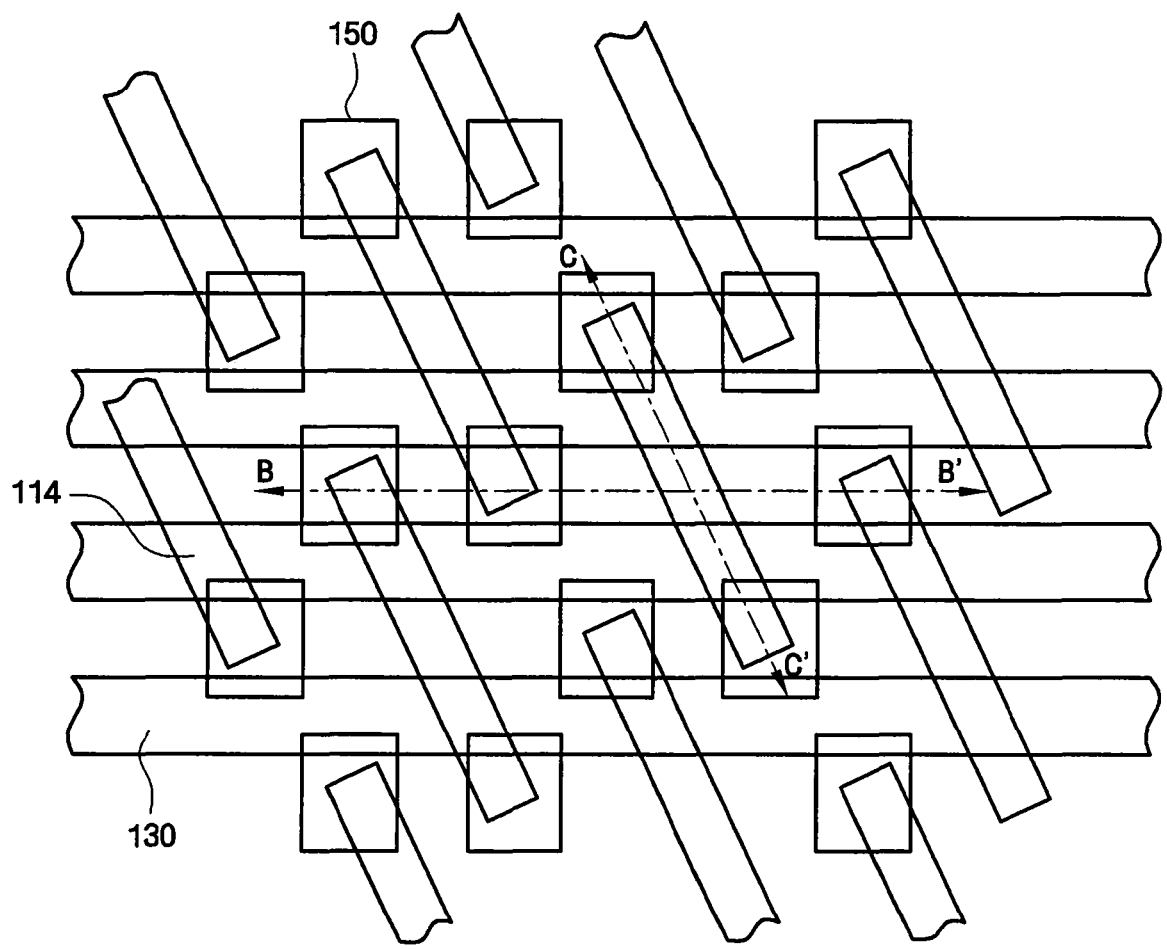
Figure 10B:
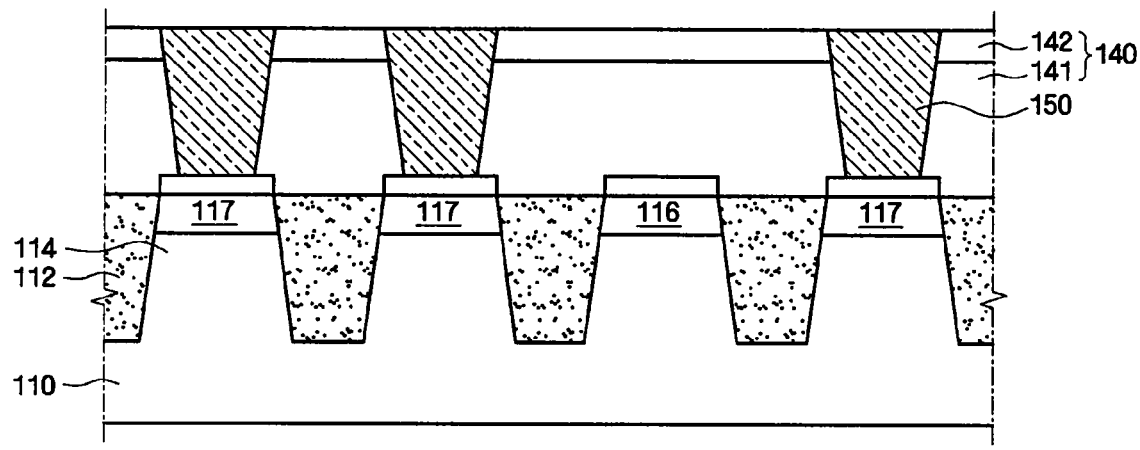
Figure 10C:
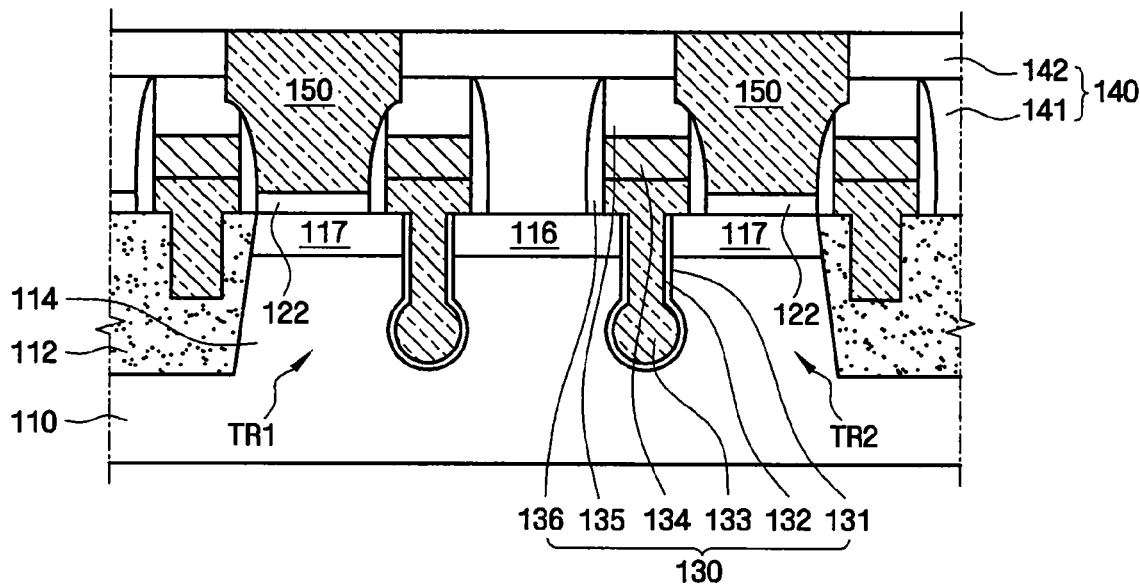

Referring to FIGS. 10A through 10C, a first epitaxial layer 120 is formed on the first junction areas 116, and a second epitaxial layer 122 is formed on the second junction areas 117. The formation of the first and second epitaxial layers 120 and 122 may be performed by putting the substrate 110 in a chamber, and then supplying a silicon source gas and a dopant source gas into the chamber.

Thereafter, a plurality of contact pads 150 are formed on the second epitaxial layer 122. The contact pads 150 may be self-aligned contact (SAC) pads.

Specifically, an insulation layer is formed on the substrate 110 and on the gate lines 130. Thereafter, the insulation layer is planarized so that the top surfaces of the gate lines 130 can be exposed. The insulation layer may have excellent gap-filling characteristics. Thereafter, a capping layer is formed on the insulation layer. The capping layer improves the morphology of the top surfaces of the gate lines 130. For example, the capping layer may be formed of boro-phospho-silicate-glass (BPSG). Thereafter, a first interlayer dielectric layer pattern 140 is formed by patterning the capping layer and the insulation layer. The first interlayer dielectric layer pattern 140 exposes the second epitaxial layer 120, and respectively includes an insulation layer pattern 141 and a capping layer pattern 142. Thereafter, the contact pads 150 are formed by filling spaces in the first interlayer dielectric layer pattern 140 with doped polysilicon.

Figure 11A:
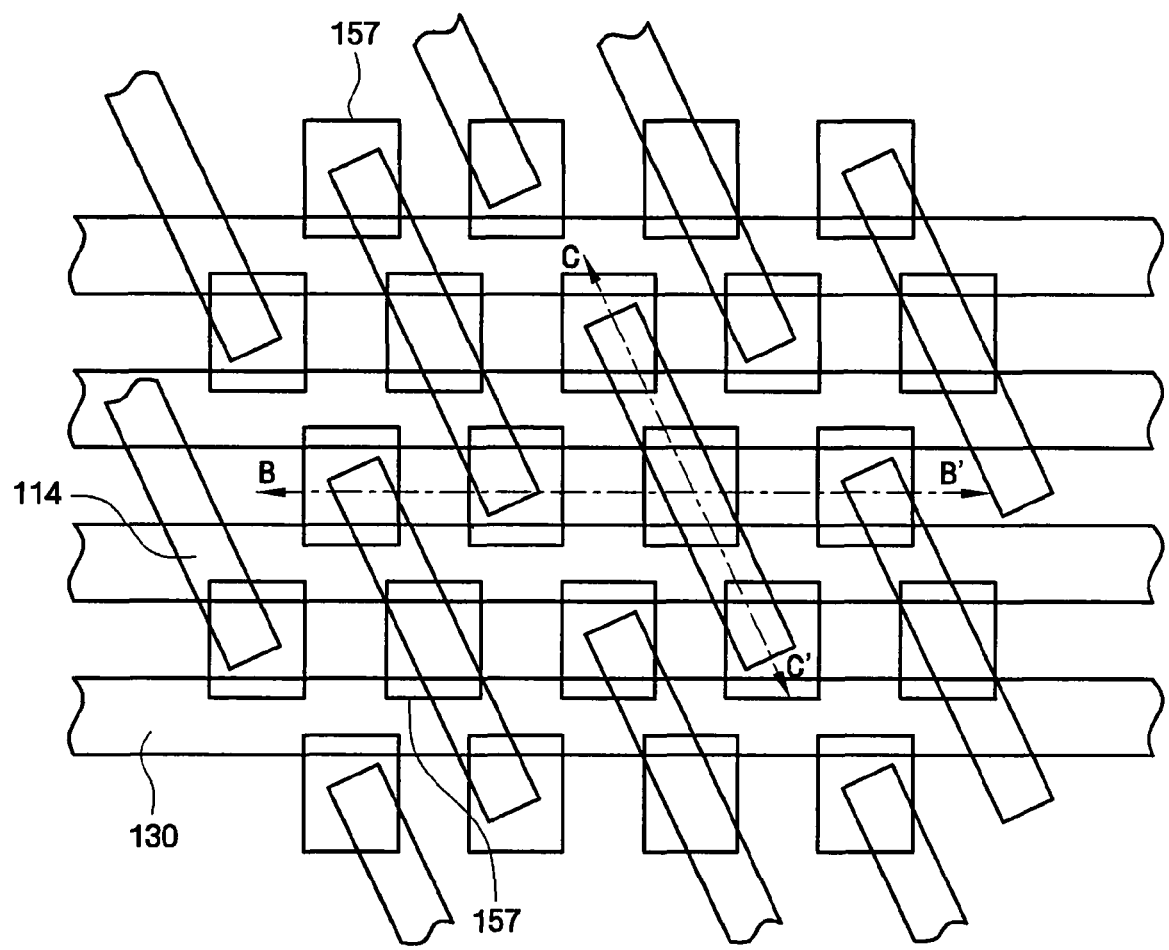
Figure 11B:
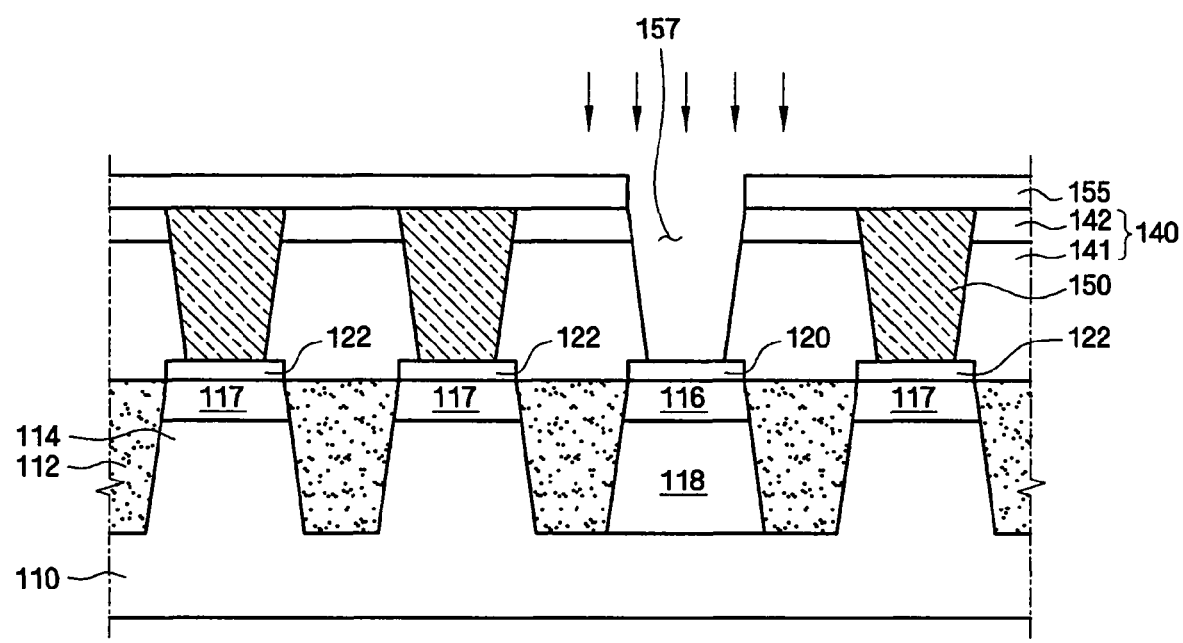
Figure 11C:
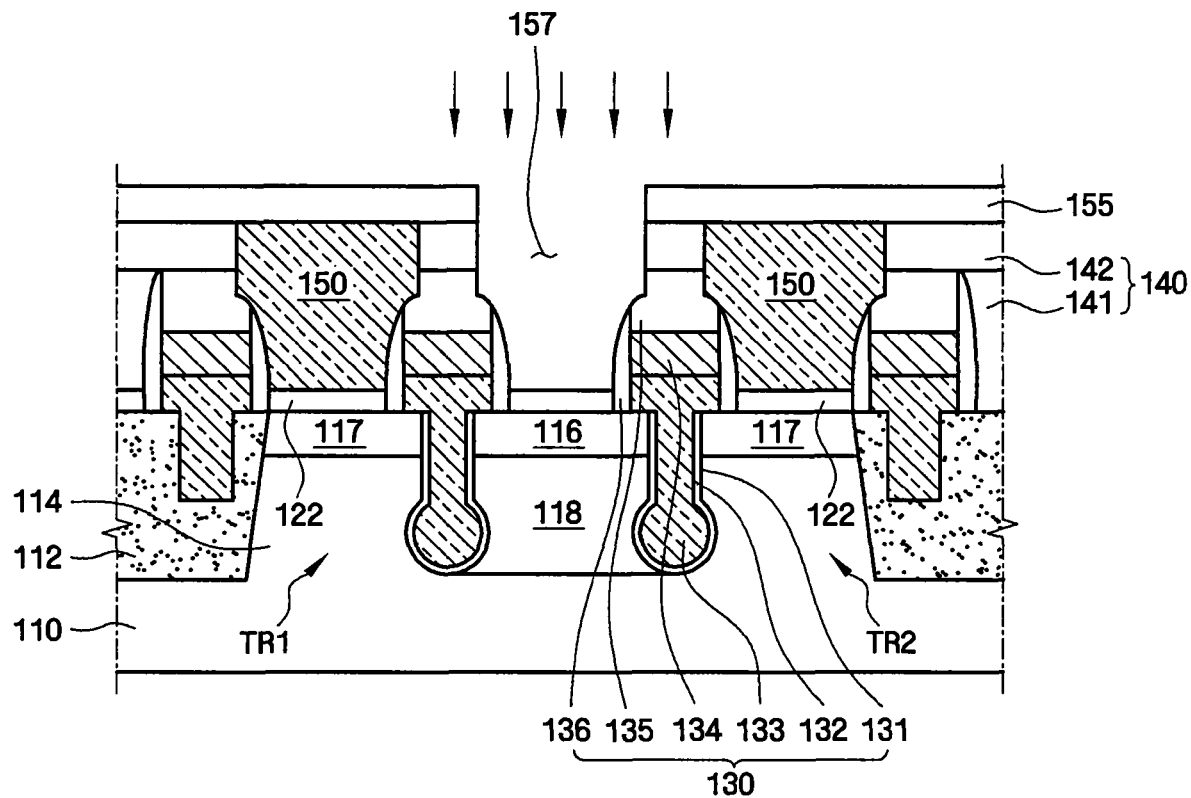

Referring to FIGS. 11A through 11C, a second interlayer dielectric layer is formed on the first interlayer dielectric layer pattern 140 and on the contact pads 150.

Thereafter, a plurality of first contact holes 157 are formed by patterning the second interlayer dielectric layer and the first interlayer dielectric layer pattern 140. The first contact holes 157 expose the first epitaxial layer 120.

Then, a third junction area 118 is formed in the substrate 110 by using the first interlayer dielectric layer pattern 140 and second interlayer dielectric layer pattern 155 as masks.

Next, a plurality of bitline contacts 160 are respectively formed in the first contact holes 157.

Here, the first contact holes 157 are formed, and then the third junction area 118 and the bitline contacts 160 are formed using the first interlayer dielectric layer pattern 140 and the second interlayer dielectric layer pattern 155 as masks. That is, the third junction area 118 may be formed using the same masks as those used to form the bitline contacts 160, thereby simplifying the manufacture of a semiconductor integrated circuit device and reducing the manufacturing cost of a semiconductor integrated circuit device.

However, the third junction area 118 may be formed using different masks from those used to form the bitline contacts 160. For example, the third junction area 118 may be formed using an additional ion implantation operation after the formation of the unit active regions 114. Alternatively, the third junction area 118 may be formed using an additional ion implantation operation after the formation of the recessed trenches 131 or after the formation of the gate lines 130.

If the third junction area 118 is formed using the same masks as those used to form the bitline contacts 160, the third junction area 118 can be completely localized between recessed channels of access transistors TR1 and TR2, instead of diffusing to nearby areas due to heat and thus being undesirably connected to the first junction areas 117. If the third junction area 118 is formed at an early stage of the manufacture of a semiconductor integrated circuit device (e.g., after the formation of the unit active regions 114, after the formation of the recessed trenches 131, or after the formation of the gate lines 130), the third junction area 118 may diffuse to nearby areas due to heat in subsequent processes. Since the size of unit memory cells in a $6F^2$ layout is very small, the third junction area 118 is highly likely to diffuse to nearby areas and thus be undesirably connected to the first junction areas 117. Therefore, there is a need to prevent the diffusion of the third junction area 118, which can be filled by forming the third junction area 118 using the same masks as those used to form the bitline contacts 160.

Figure 12A:
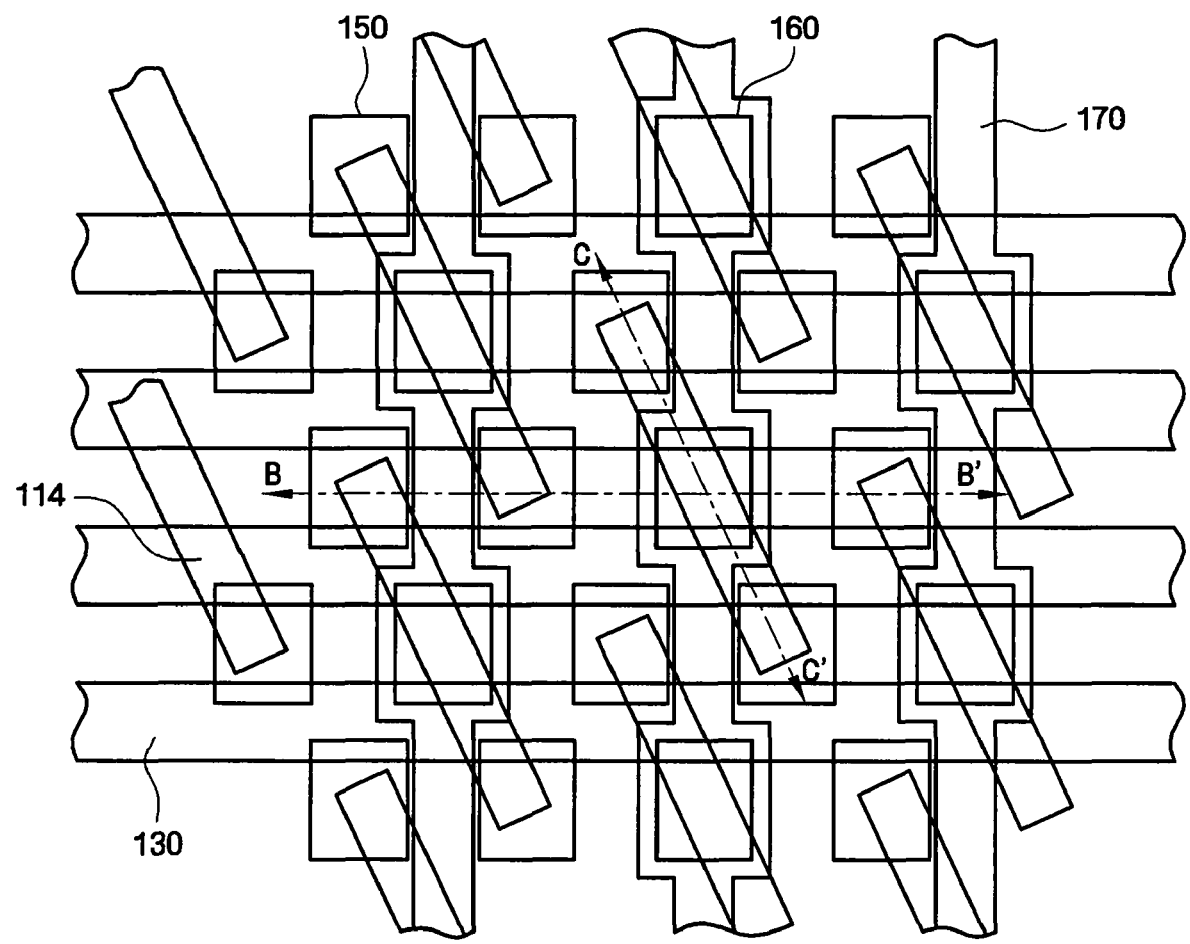
Figure 12B:
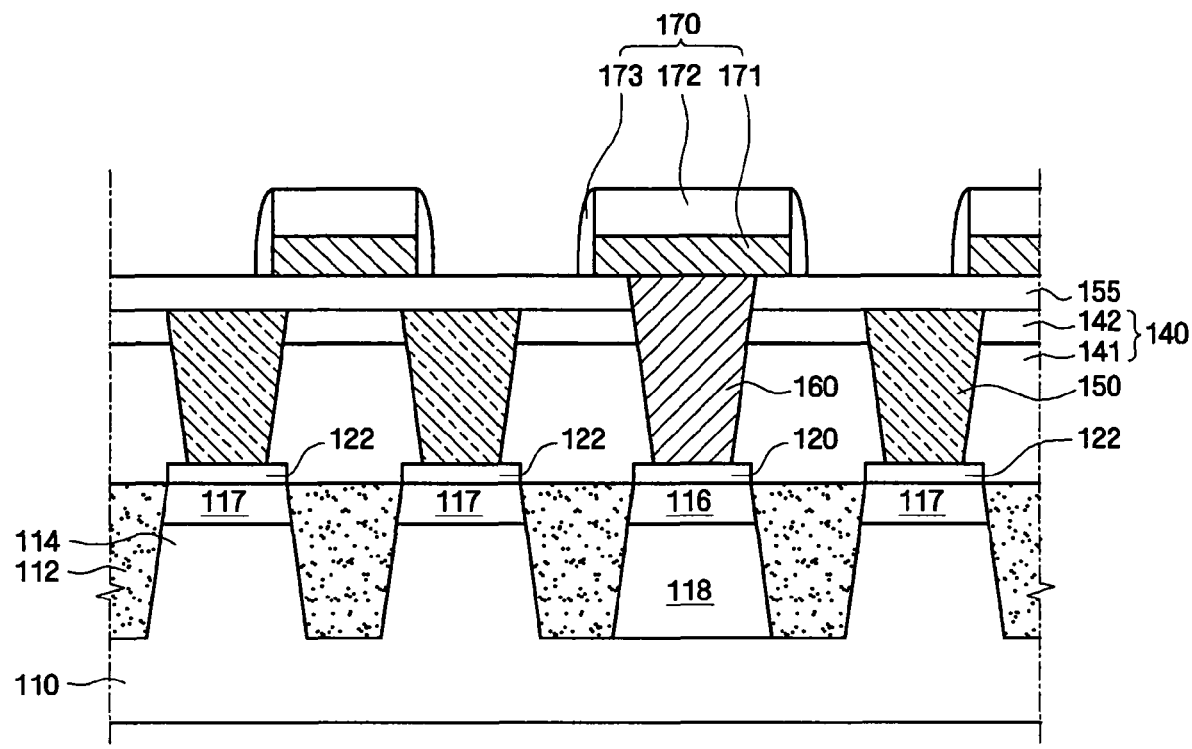
Figure 12C:
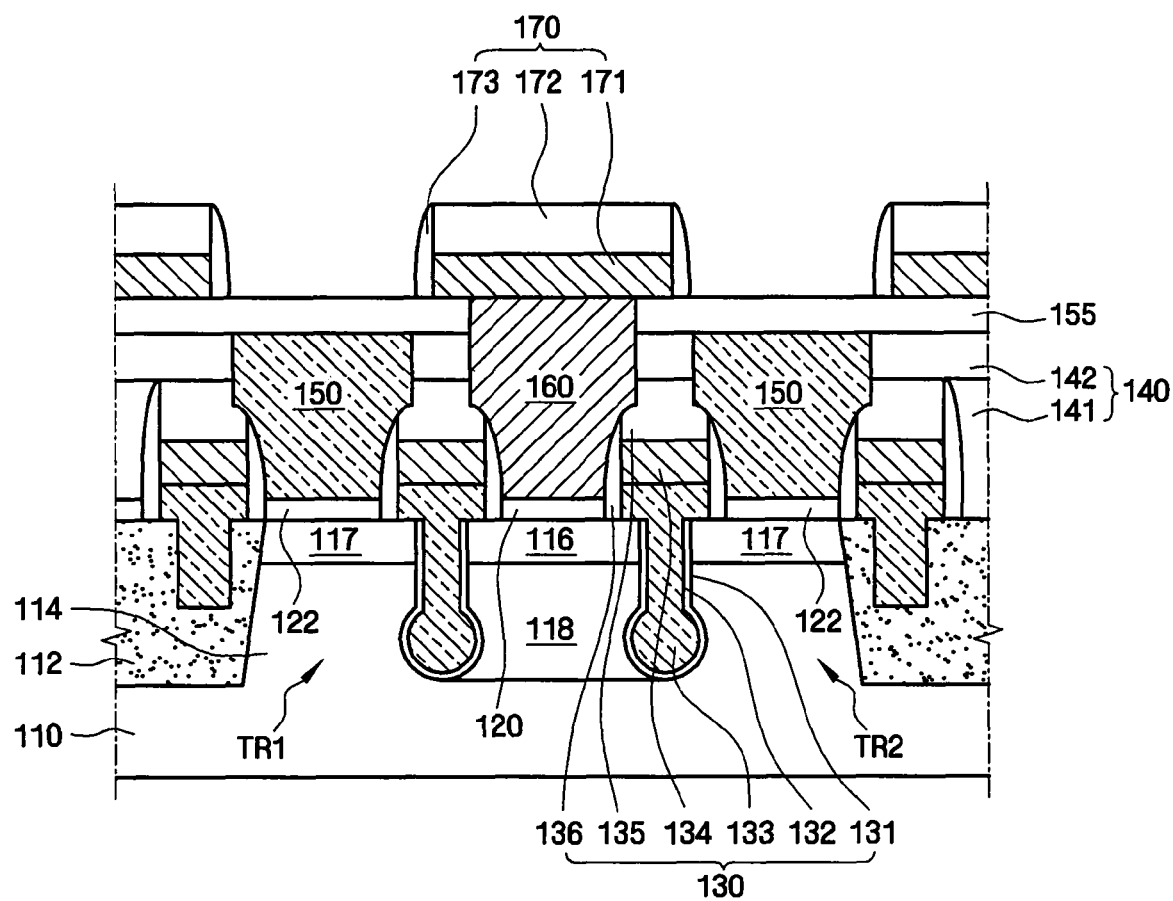

Referring to FIGS. 12A through 12C, a plurality of bitlines 170 are formed on the bitline contacts 160. The bitlines 170 extend in a third direction DR3 which forms an acute angle with the first direction DR1.

Specifically, a metallic layer and a mask layer are sequentially formed on the second interlayer dielectric layer patterns 155 and on the bitline contacts 160, and a plurality of metallic layer patterns 171 and a plurality of mask layer patterns 172 are formed by patterning the metallic layer and the mask layer. Thereafter, the bitlines 170 are formed by forming a pair of spacers 173 on both sidewalls of each of the stacks of the metallic layer patterns 171 and the mask layer patterns 172.

Figure 13A:
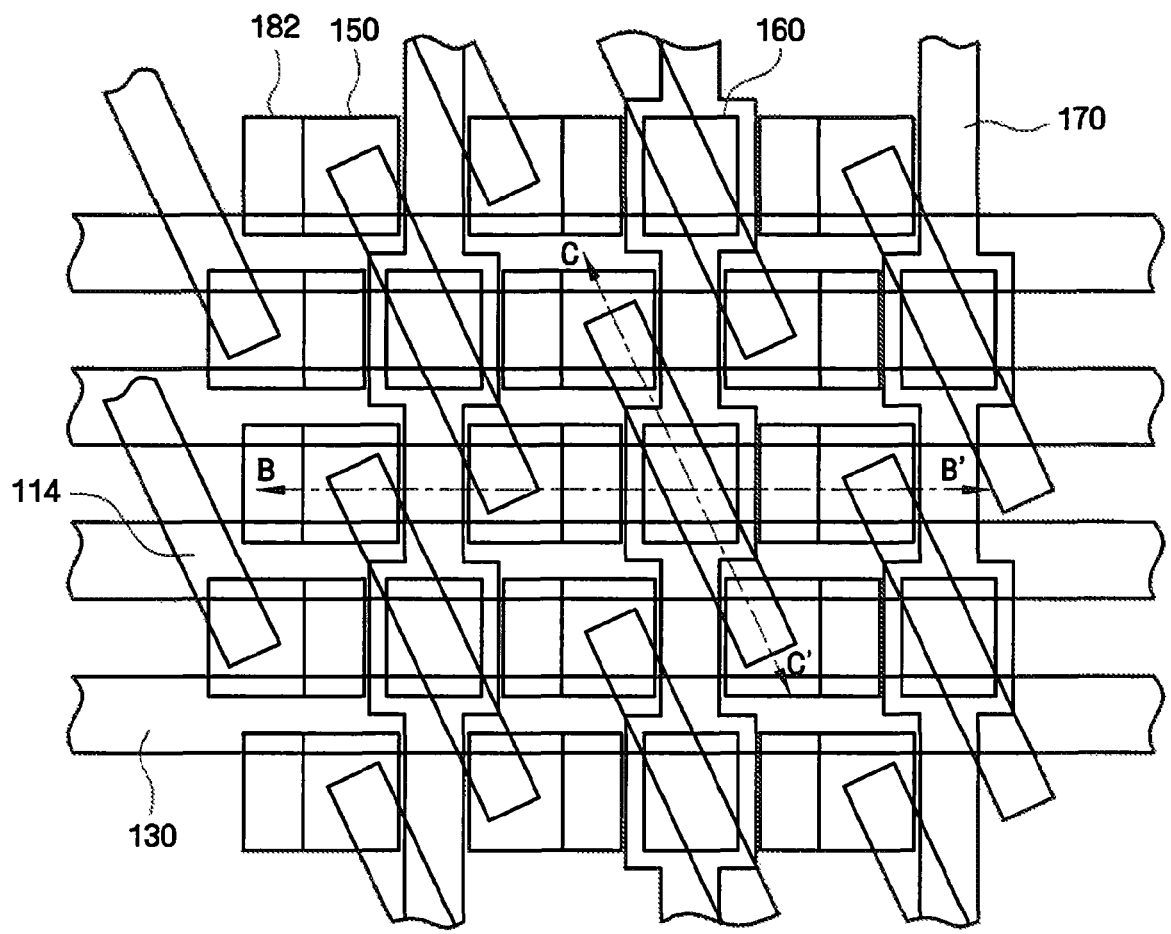
Figure 13B:
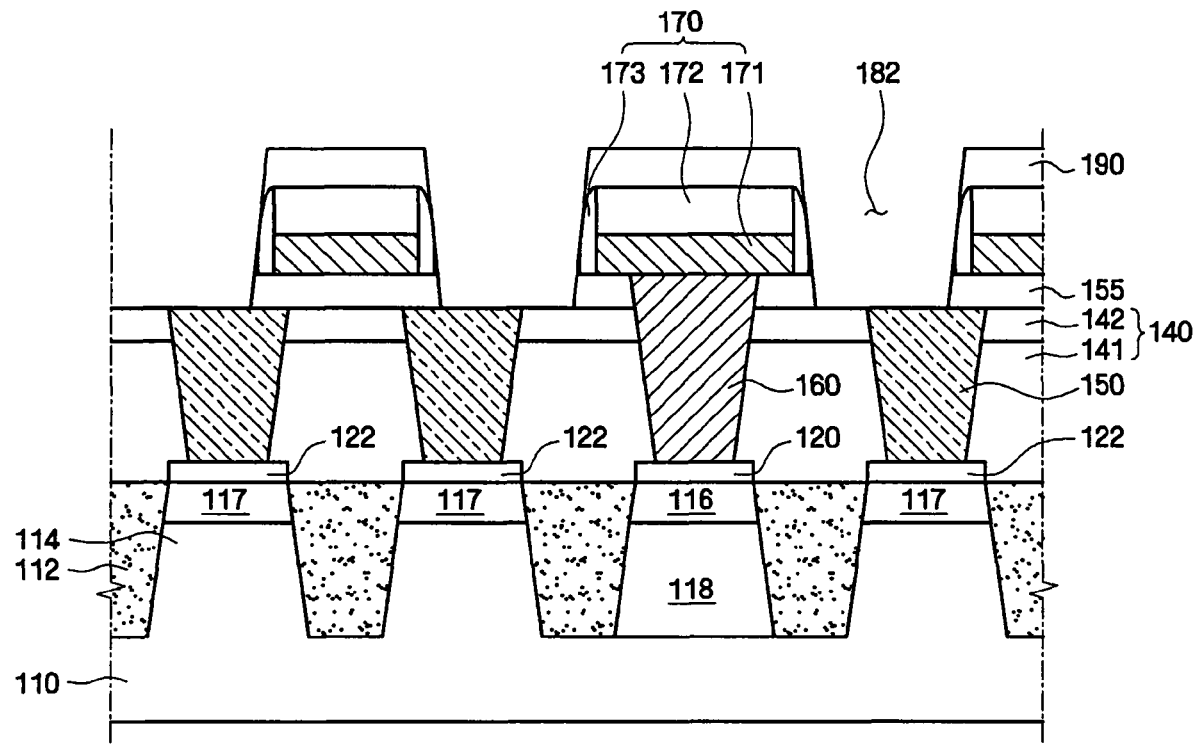
Figure 13C:
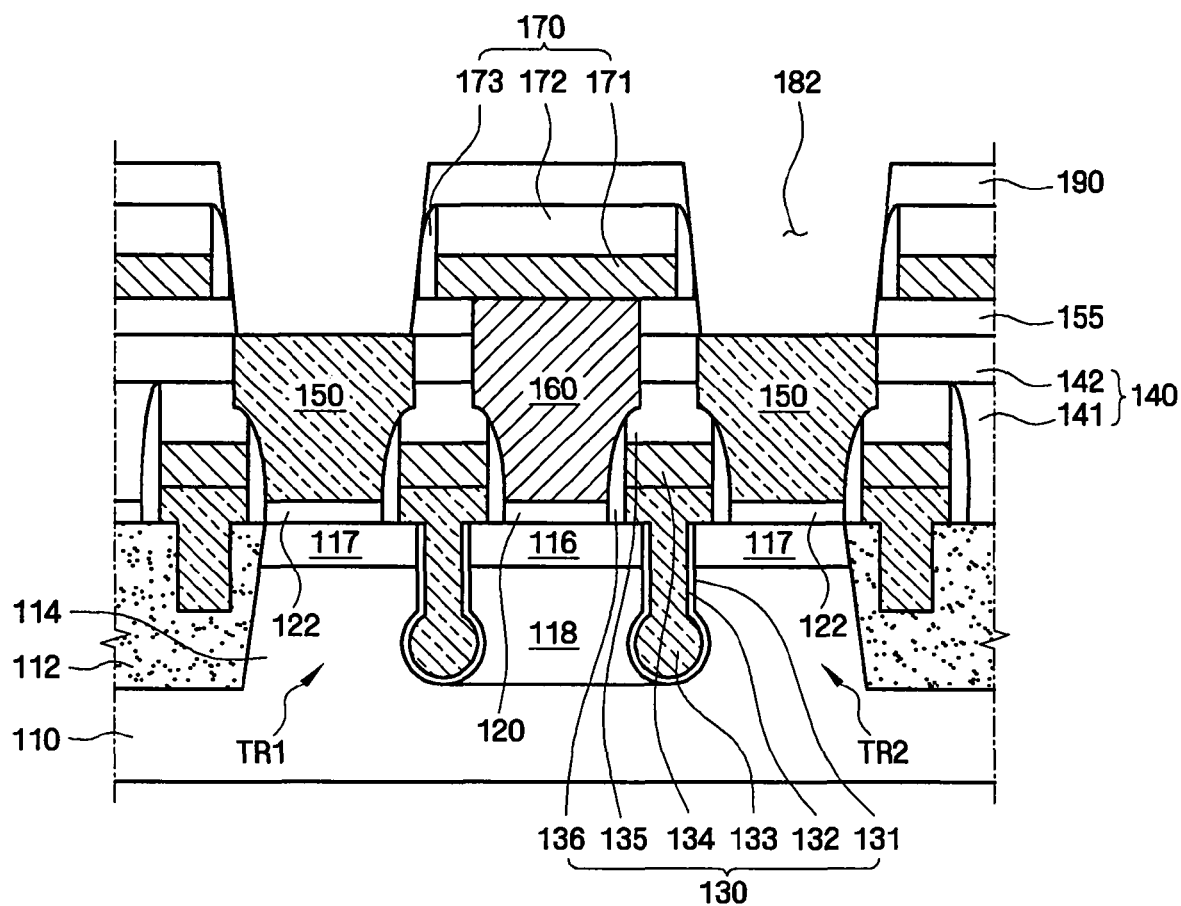

Referring to FIGS. 13A through 13C, a third interlayer dielectric layer 190 is formed on the second interlayer dielectric layer pattern 155 and the bitlines 170. The third interlayer dielectric layer 190 may be formed of a material with excellent gap filling characteristics so that spaces between the bitlines 170 can be filled with the third interlayer dielectric layer 190.

Thereafter, a plurality of second contact holes 182 are formed by patterning the third interlayer dielectric layer 190 and the second interlayer dielectric layer pattern 155 using an anisotropic etching method. The second contact holes 182 respectively expose the contact pads 150.

Referring to FIGS. 1A through 1C, the bottom portions of the second contact holes 182 may be enlarged using an isotropic etching method. Thereafter, a plurality of storage node contacts 180 are respectively formed in the second contact holes 182. Since the storage node contacts 180 have enlarged bottom portions, the storage node contacts 180 can be easily placed in contact with the contact pads 150.

It would be apparent to one of ordinary skill in the art to which the present invention pertains that methods of fabricating a semiconductor integrated circuit device according to other embodiments of the present invention can be easily derived from the method of fabricating a semiconductor integrated circuit device according to the embodiment of FIGS. 9A through 13C, and, thus, detailed descriptions of the methods of fabricating a semiconductor integrated circuit device according to the other embodiments of the present invention will be omitted.

According to the present invention, bitlines are directly connected to a substrate (or an epitaxial layer) using bitline contacts. Thus, it is possible to prevent 2-bit failures from occurring due to an etchant (e.g., HF) used to form storage node contacts. In addition, according to the present invention, bitline contacts are formed on a first epitaxial layer. Thus, it is possible to reduce the amount of leakage current and the probability of occurrence of a short channel effect. Moreover, according to the present invention, third junction areas are formed using the same masks as those used to form bitline contacts. Thus, it is possible to simplify the manufacture of a semiconductor integrated circuit device. In conclusion, according to the present invention, it is possible to fabricate a semiconductor integrated circuit device with a stable $6F^2$ layout, and, thus, to increase the yield of a semiconductor integrated circuit device.

According to an aspect of the present invention, there is provided a semiconductor integrated circuit device including: a substrate; a plurality of unit active regions disposed in the substrate and extending in a first direction; first and second access transistors including first and second gate lines disposed on the substrate and extending across the unit active regions in a second direction forming an acute angle with the first direction; a first junction area disposed in the substrate between the first and second gate lines and second junction areas disposed on one side of the first and second gate lines where the first junction area is not disposed, and that are located on opposite sides of the first junction area; a plurality of bitlines which are formed on the substrate and extend in a third direction forming an acute angle with the first direction; and a plurality of bitline contacts which directly connect the first junction area and the bitlines.

The semiconductor integrated circuit device may further include a first epitaxial layer disposed on the first junction area, wherein the bitline contacts directly connect the first epitaxial layer and the bitlines. The semiconductor integrated circuit device may further include: a plurality of storage electrodes disposed on the substrate; and a plurality of connecting structures which connect the second junction areas and the storage electrodes and include: a plurality of contact pads disposed on the second junction areas; and a plurality of storage node contacts disposed on the contact pads and connected to the storage electrodes. The semiconductor integrated circuit device may further include a second epitaxial layer disposed on the second junction areas, wherein the contact pads are formed on the second epitaxial layer. Lower portions of the storage node contacts may be wider than upper portions of the storage node contacts.

The first and second access transistors may have recessed channels.

The semiconductor integrated circuit device may further include a third junction area which is formed between the recessed channels of the first and second access transistors, and below the first junction area. The semiconductor integrated circuit device may further include a plurality of tabs disposed at portions of each of the bitlines to which the bitline contacts are connected.

According to another aspect of the present invention, there is provided a semiconductor integrated circuit device including: a substrate; a plurality of unit active regions disposed in the substrate; a plurality of gate lines disposed on the substrate, extending across the unit active regions, and separating the unit active regions located on both sides of the respective gate lines into first regions and second regions; and a plurality of contact pads disposed in the second regions and not disposed in the first regions, wherein the contact pads are respectively disposed at a plurality of apexes of a hexagonal honeycomb structure.

The unit active regions may extend in a first direction and the gate lines may extend in a second direction which forms an acute angle with the first direction.

The semiconductor integrated circuit device may further include a plurality of storage node contacts disposed on the contact pads, wherein lower portions of the storage node contacts are wider than upper portions of the storage node contacts.

The semiconductor integrated circuit device may further include: a plurality of bitlines disposed on the substrate; and a plurality of bitline contacts which directly connect the first regions and the bitlines, wherein the unit active regions extend in a first direction and the bitlines extend in a third direction which forms an acute angle with the first direction.

The bitline contacts may be respectively disposed in a plurality of cells which form the hexagonal honeycomb structure.

The semiconductor integrated circuit device may further include first epitaxial layers disposed in the first regions, wherein the bitline contacts directly connect the first epitaxial layers and the bitlines.

The unit active regions may extend in a first direction and the bitlines may extend in a third direction which forms an acute angle with the first direction.

The semiconductor integrated circuit device may further include a plurality of tabs disposed on portions of each of the bitlines to which the bitline contacts are connected. The semiconductor integrated circuit device may further include second epitaxial layers disposed in the second regions, wherein the contact pads are formed on the second epitaxial layers. The semiconductor integrated circuit device may further comprise: a plurality of first junction areas disposed in the first regions; a plurality of second junction areas disposed in the second regions; and a plurality of third junction areas disposed below the first junction areas.

According to another aspect of the present invention, there is provided a semiconductor integrated circuit device including: a substrate; a plurality of unit active regions which are formed in the substrate; a plurality of gate lines which are formed on the substrate, extend across the unit active regions, classify the unit active regions located on both sides of the respective gate lines into first regions and second regions; first epitaxial layers which are formed in the first regions, respectively; a plurality of bitlines which are formed on the substrate; and a plurality of bitline contacts which directly connect the first epitaxial layer and the bitlines.

The semiconductor integrated circuit device may further include: second epitaxial layers which are formed in the second regions, respectively; a plurality of contact pads which are formed on the second epitaxial layer; and a plurality of storage node contacts which are respectively formed on the contact pads. The unit active regions may extend in a first direction; the gate lines may extend in a second direction which forms an acute angle with the first direction; and the bitlines may extend in a third direction which forms an acute angle with the first direction.

According to another aspect of the present invention, there is provided a semiconductor integrated circuit device including: a substrate which is divided into a cell array region and a peripheral circuit region; a plurality of unit active regions which are formed in the cell array region and extend in a first direction; a plurality of gate lines which are formed in the cell array region and extend across the unit active regions in a second direction that forms an acute angle with the first direction; a plurality of first conductive lines which are formed in the cell array region; a plurality of first contacts which directly connect the first conductive lines and a plurality of unit active regions that are disposed between the gate lines, and which are formed of a different material from the material of the first conductive lines; a plurality of second conductive lines which are formed in the peripheral circuit region; and a plurality of second contacts which directly connect a predetermined area in the peripheral circuit region and the second conductive lines, and are formed of the same material as the material of the second conductive lines.

The first conductive lines may be formed of a metal and the first contacts may be formed of doped polysilicon. The second conductive lines and the second contacts may be formed of metal. The first conductive lines may be level with the second conductive lines.

The semiconductor integrated circuit device may further include an epitaxial layer which is interposed between the first contacts and the unit active regions that are disposed between the gate lines.

According to another aspect of the present invention, there is provided a method of fabricating a semiconductor integrated circuit device, the method including: forming a plurality of unit active regions in a substrate so that the unit active regions extend in a first direction; forming a plurality of gate lines on the substrate so that the gate lines extend in a second direction and can separate the unit active regions located on both sides of the respective gate lines into first regions and second regions; forming a plurality of contact pads in the second regions; forming a plurality of bitline contacts in the first regions; forming a plurality of bitlines on the bitline contacts such that the bitlines extend in a third direction; and forming a plurality of storage node contacts on the contact pads. The second direction forms an acute angle with the first direction, and the third direction also forms an acute angle with the first direction.

The method may further comprise: forming first epitaxial layers and second epitaxial layers in the first regions and second regions, respectively, wherein the formation of the contact pads comprises forming the contact pads on the second epitaxial layer, and the formation of the bitline contacts comprises forming the bitline contacts on the first epitaxial layer.

The formation of the contact pads may further include: forming a first interlayer dielectric layer pattern on the gate lines, respectively, so that the second regions can be exposed through the first interlayer dielectric layer pattern; and forming the contact pads in the first interlayer dielectric layer pattern.

The formation of the bitline contacts may further comprise: forming a second interlayer dielectric layer on the first interlayer dielectric layer pattern and on the contact pads; forming a plurality of first contact holes by patterning the second interlayer dielectric layer and the first interlayer dielectric layer pattern, the first contact holes exposing the first epitaxial layer; and forming the bitline contacts in the first contact holes, respectively.

The method may further include forming a plurality of junction areas in the substrate using, as masks, the first interlayer dielectric layer pattern and second interlayer dielectric layer pattern which result from the formation of the first contact holes.

The formation of the storage node contacts may include: forming a third interlayer dielectric layer on the bitlines and on the second interlayer dielectric layer pattern which results from the formation of the first contact holes; forming a plurality of second contact holes by patterning the third interlayer dielectric layer and the second interlayer dielectric layer pattern, the second contact holes exposing the contact pads; and forming the storage node contacts in the second contact holes. The formation of the second contact holes may further comprise enlarging the second contact holes by performing an isotropic etching operation.

The contact pads may be respectively disposed at a plurality of apexes of a hexagonal honeycomb structure. The formation of the bitline contacts may further comprise forming the bitline contacts in a plurality of cells, respectively, which form the hexagonal honeycomb structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor integrated circuit device comprising:
   a substrate;
   a plurality of unit active regions disposed in the substrate and extending in a first direction;
   first and second access transistors including:
   first and second gate lines disposed on the substrate and extending across the unit active regions in a second direction, the second direction forming an acute angle with the first direction;

a first junction area disposed in the substrate between the first and second gate lines; and second junction areas disposed on sides of the first and second gate lines where the first junction area is not disposed;

a plurality of bitlines disposed on the substrate and extending in a third direction, the third direction forming an acute angle with the first direction;

a plurality of bitline contacts connecting the first junction area and the bitlines, wherein the unit active regions located on both sides of the respective first and second gate lines are separated into first regions and second regions, a plurality of contact pads being formed on the second regions, wherein a first epitaxial layer and a second epitaxial layer are formed in the first regions and second regions, respectively, and wherein:
a first interlayer dielectric layer pattern is formed on the first and second gate lines such that the second regions are exposed through the first interlayer dielectric layer pattern and contact pads are formed in the first interlayer dielectric layer pattern, a second interlayer dielectric layer is formed on the first interlayer dielectric layer pattern and on the contact pads, a plurality of first contact holes are formed by patterning the second interlayer dielectric layer and the first interlayer dielectric layer pattern, the first contact holes exposing the first epitaxial layers, the bitline contacts being formed in the first contact holes, a third interlayer dielectric layer is formed on the bitlines and on the second interlayer dielectric layer pattern, and a plurality of second contact holes is formed by patterning the third interlayer dielectric layer and the second interlayer dielectric layer pattern, the second contact holes exposing the contact pads, the second contact holes being formed by enlarging the second contact holes by performing an isotropic etching operation, storage node contacts being formed in the second contact holes.

2. The semiconductor integrated circuit device of claim 1, wherein the first epitaxial layer is disposed on the first junction area, wherein the bitline contacts directly connect the first epitaxial layer and the bitlines.

3. The semiconductor integrated circuit device of claim 1, further comprising:
a plurality of storage electrodes disposed on the substrate; and
a plurality of connecting structures which connect the second junction areas and the storage electrodes,
wherein the contact pads are disposed on the second junction areas and the storage node contacts are disposed on the contact pads and connected to the storage electrodes.

4. The semiconductor integrated circuit device of claim 3, wherein the second epitaxial layer is disposed on the second junction areas, and the contact pads are formed on the second epitaxial layer.

5. The semiconductor integrated circuit device of claim 3, wherein lower portions of the storage node contacts are wider than upper portions of the storage node contacts.

6. The semiconductor integrated circuit device of claim 1, wherein the first and second access transistors have recessed channels.

7. The semiconductor integrated circuit device of claim 6, further comprising a third junction area which is formed between the recessed channels of the first and second access transistors, and below the first junction area.

8. The semiconductor integrated circuit device of claim 1, further comprising a plurality of tabs disposed at portions of each of the bitlines to which the bitline contacts are connected.

9. A semiconductor integrated circuit device comprising:
a substrate;
a plurality of unit active regions disposed in the substrate;
a plurality of gate lines disposed on the substrate, extending across the unit active regions, and separating the unit active regions located on both sides of the respective gate lines into first regions and second regions; and
a plurality of contact pads disposed in the second regions and not disposed in the first regions,
a plurality of bitlines disposed on the substrate;
a first epitaxial layer disposed in the first regions;
a second epitaxial layer disposed in the second regions;
wherein the contact pads are respectively disposed at a plurality of apexes of a hexagonal honeycomb structure,
wherein:
a first interlayer dielectric layer pattern is formed on the gate lines such that the second regions are exposed through the first interlayer dielectric layer pattern and the contact pads are formed in the first interlayer dielectric layer pattern, a second interlayer dielectric layer is formed on the first interlayer dielectric layer pattern and on the contact pads, a plurality of first contact holes are formed by patterning the second interlayer dielectric layer and the first interlayer dielectric layer pattern, the first contact holes exposing the first epitaxial layer, the bitline contacts being formed in the first contact holes, a third interlayer dielectric layer is formed on the bitlines and on the second interlayer dielectric layer pattern, and a plurality of second contact holes is formed by patterning the third interlayer dielectric layer and the second interlayer dielectric layer pattern, the second contact holes exposing the contact pads, the second contact holes being formed by enlarging the second contact holes by performing an isotropic etching operation, storage node contacts being formed in the second contact holes.

10. The semiconductor integrated circuit device of claim 9, wherein the unit active regions extend in a first direction and the gate lines extend in a second direction which forms an acute angle with the first direction.

11. The semiconductor integrated circuit device of claim 9, further comprising a plurality of storage node contacts disposed on the contact pads, wherein lower portions of the storage node contacts are wider than upper portions of the storage node contacts.

12. The semiconductor integrated circuit device of claim 9, wherein a plurality of bitline contacts directly connect the first regions and the bitlines, and
wherein the unit active regions extend in a first direction and the bitlines extend in a third direction which forms an acute angle with the first direction.

13. The semiconductor integrated circuit device of claim 12, wherein the bitline contacts are respectively disposed in a plurality of cells which form the hexagonal honeycomb structure.

14. The semiconductor integrated circuit device of claim 12, wherein the bitline contacts directly connect the first epitaxial layers and the bitlines.

15. The semiconductor integrated circuit device of claim 12, further comprising a plurality of tabs disposed on portions of each of the bitlines to which the bitline contacts are connected.

16. The semiconductor integrated circuit device of claim 9, wherein the contact pads are formed on the second epitaxial layers.

17. The semiconductor integrated circuit device of claim 9, further comprising:
   a plurality of first junction areas disposed in the first regions;
   a plurality of second junction areas disposed in the second regions; and
   a plurality of third junction areas disposed below the first junction areas.

18. A method of fabricating a semiconductor integrated circuit device, the method comprising:
   forming a plurality of unit active regions in a substrate so that the unit active regions extend in a first direction;
   forming a plurality of gate lines on the substrate so that the gate lines extend in a second direction and separate the unit active regions located on both sides of the respective gate lines into first regions and second regions, the second direction forming an acute angle with the first direction;
   forming a plurality of contact pads on the second regions;
   forming a plurality of bitline contacts on the first regions;
   forming a plurality of bitlines on the bitline contacts such that the bitlines extend in a third direction, the third direction forming an acute angle with the first direction; and
   forming a plurality of storage node contacts on the contact pads,
   forming first epitaxial layers and second epitaxial layers in the first regions and second regions, respectively,
   wherein the bitline contacts connect the first regions and the bitlines,
   wherein forming the contact pads comprises forming the contact pads on the second epitaxial layer, and forming the bitline contacts comprises forming the bitline contacts on the first epitaxial layer, and
wherein:
   forming the contact pads further comprises:
      forming a first interlayer dielectric layer pattern on the gate lines such that the second regions are exposed through the first interlayer dielectric layer pattern; and
      forming the contact pads in the first interlayer dielectric layer pattern;
   forming the bitline contacts further comprises:
      forming a second interlayer dielectric layer on the first interlayer dielectric layer pattern and on the contact pads;
      forming a plurality of first contact holes by patterning the second interlayer dielectric layer and the first interlayer dielectric layer pattern, the first contact holes exposing the first epitaxial layer; and
      forming the bitline contacts in the first contact holes; and
   forming the storage node contacts comprises:
      forming a third interlayer dielectric layer on the bitlines and on the second interlayer dielectric layer pattern;
      forming a plurality of second contact holes by patterning the third interlayer dielectric layer and the second interlayer dielectric layer pattern, the second contact holes exposing the contact pads, wherein forming the second contact holes further comprises enlarging the second contact holes by performing an isotropic etching operation; and
   forming the storage node contacts in the second contact holes.

* * * * *